United States Patent
Taninaka et al.

(10) Patent No.: US 6,583,446 B1
(45) Date of Patent: Jun. 24, 2003

(54) ARRAY OF LIGHT-EMITTING ELEMENTS AND EMISSION-ALTERING ELEMENTS

(75) Inventors: Masumi Taninaka, Hachioji (JP); Hiroaki Kikuchi, Hachioji (JP); Mitsuhiko Ogihara, Hachioji (JP); Hiroshi Hamano, Hachioji (JP)

(73) Assignee: Oki Data Corporation, Tokyo (JP)

( * ) Notice: Subject to any disclaimer, the term of this patent is extended or adjusted under 35 U.S.C. 154(b) by 6 days.

(21) Appl. No.: 09/595,248

(22) Filed: Jun. 15, 2000

(30) Foreign Application Priority Data

Jun. 18, 1999 (JP) .......................... 11-172609

(51) Int. Cl.[7] .................................. H01L 33/00
(52) U.S. Cl. .......................... 257/93; 257/96
(58) Field of Search ................... 257/93, 90, 96, 257/97, 88, 91

(56) References Cited

U.S. PATENT DOCUMENTS 4,275,403 A * 6/1981 Lebaille .................. 357/17
4,933,601 A * 6/1990 Sagawa et al. ............ 313/500
5,373,174 A * 12/1994 Yamamoto ................ 257/88

FOREIGN PATENT DOCUMENTS

EP 0838861 * 4/1998

OTHER PUBLICATIONS

"LED Purinta no Sekkei" (LED Printer Design), pp. 60–63, Trikeppusu KK (Aug. 31, 1997).

* cited by examiner

*Primary Examiner*—Douglas A. Wille
(74) *Attorney, Agent, or Firm*—Akin, Gump, Strauss, Hauer & Feld, L.L.P.

(57) ABSTRACT

An array of light emitting elements, formed as regions of a second conductive type in a semiconductor layer of a first conductive type, includes at least one emission-altering element provided for the purpose of altering the amount of light emitted by an adjacent light-emitting element. The emission-altering element may be a trench, an opaque member, or a non-emitting region of the second conductive type. Light-emitting elements in the interior of the array can be made to emit the same amount of light as the light-emitting elements at the ends of the array by placing one emission-altering element between at least every second pair of mutually adjacent light-emitting elements. If the array is divided into blocks, the emission-altering elements can also provide electrical isolation between the blocks.

27 Claims, 41 Drawing Sheets

ARRAY OF LIGHT-EMITTING ELEMENTS AND EMISSION-ALTERING ELEMENTS

BACKGROUND OF THE INVENTION

The present invention relates to an array of light-emitting elements, more particularly to an array with a structure that alters the amount of emitted light so that all light-emitting elements to emit the same amount of light, or all emit increased amounts of light.

Arrays of light-emitting elements such as light-emitting diodes (LEDs) are used as light sources in electrophotographic printers. A typical LED array is a semiconductor chip with a row of diffusion regions from which light is emitted when current is supplied. An LED printer may include many of these chips, placed end-to-end to form a single linear array of light-emitting elements.

There is a strong demand for electrophotographic printers with high printing quality, which requires the printing of small, uniform dots with high resolution. For LED printers, this requires a linear array in which the light-emitting elements are closely and uniformly spaced, and have uniform light-emitting characteristics. The uniform spacing requirement includes the spacing between the light-emitting elements at adjacent ends of two different chips.

This last condition forces the light-emitting regions at the two ends of each chip to be very close to the edges of the chip. A consequent problem is that some of the light generated in these light-emitting elements is reflected or scattered by the edges of the chip and fails to be emitted in a useful direction. This problem becomes evident in very high-resolution printers, leading to faint vertical lines of under-sized dots.

Other problems encountered in the LED arrays used in printers include high cost and high power consumption. The present inventors (and others) have shown that costs can be reduced by dividing the array into blocks and employing a multi-layer wiring scheme that lessens the necessary number of wire-bonding pads. Power consumption in this wiring scheme can be reduced by placing common electrodes, which are located on the surface of the array, close to the light-emitting regions, so that the applied voltage can be reduced. A solution to the problem of reduced light emission at the ends of the array that is also applicable to this multi-layer wiring scheme is highly desirable.

Needless to say, it is also desirable to increase the amount of light emitted by the light-emitting elements, so that printing speed can be increased.

SUMMARY OF THE INVENTION

An object of the present invention is to compensate for reduced light emission at the two ends of an array of light-emitting elements, so that all light-emitting elements in the array emit the same amount of light.

Another object of the invention is to increase the amount of light emitted by the light-emitting elements in the array.

The invented array of light-emitting elements includes a semiconductor layer of a first conductive type, in which a plurality of light-emitting regions of a second conductive type are formed. The array also has at least one emission-altering element, separated from all of the light-emitting regions, altering an amount of light emitted from an adjacent one of the light-emitting regions.

The emission-altering element may be a region with a trench disposed between two mutually adjacent light-emitting regions, extending at least partway into the semiconductor layer between two adjacent light-emitting regions, or an opaque member disposed between two mutually adjacent light-emitting regions. Alternatively, the emission-altering element may be a non-emitting region of the second conductive type, disposed either between two mutually adjacent light-emitting regions or at an edge of the array.

A trench or opaque member decreases the amount of light emitted by the adjacent light-emitting regions. Emission-altering elements of these types, placed between every second pair of mutually adjacent light-emitting regions, or between every pair, can make the light-emitting regions in the interior of the array emit the same amount of light as the light-emitting regions at the ends of the array.

A non-emitting region of the second conductive type increases the amount of light emitted by the adjacent light-emitting regions. Placed at an edge of the array, the non-emitting region can make the light-emitting region nearest the edge emit the same amount of light as light-emitting regions in the interior of the array. Placed between adjacent light-emitting regions, the non-emitting region can increase the optical output of the array.

If the array has multi-layer wiring and the semiconductor layer is divided into blocks, some of the emission-altering elements can also provide electrical isolation between the blocks.

DETAILED DESCRIPTION OF THE INVENTION

Figure 1:
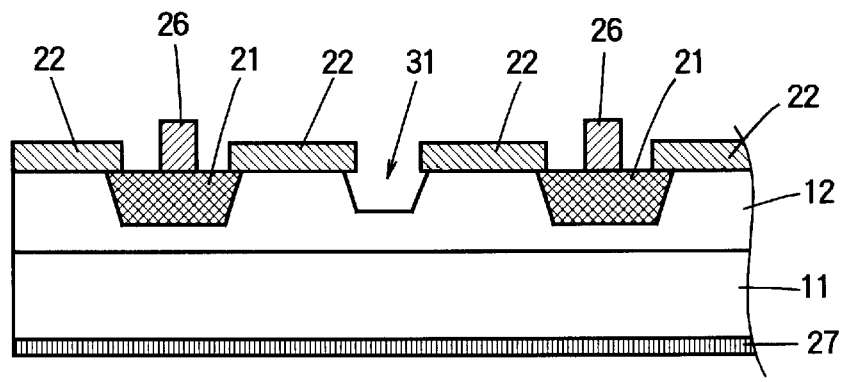
FIG. 1 is a sectional view of an LED array illustrating a first embodiment of the invention.

Embodiments of the invention will now be described with reference to the attached drawings, in which like parts are indicated by like reference characters.

In the described embodiments, the first conductive type is the n type, the second conductive type is the p type, and the light-emitting elements are LEDs, but the invention is not restricted to this arrangement. The first conductive type may be the p type and the second conductive type the n type, and the light-emitting elements may be surface-emitting laser diodes.

FIG. 1 shows one end of an LED array chip illustrating a first embodiment of the invention. The chip comprises a semiconductor substrate 11 and a semiconductor epitaxial layer 12, both of the first (n) conductive type. Light-emitting regions 21 of the second (p) conductive type are disposed in the semiconductor epitaxial layer 12, forming respective pn junctions with the n-type epitaxial layer 12. The surface of the epitaxial layer 12 is covered by a diffusion mask 22 having windows in which the light-emitting regions 21 are exposed. First-conductive-type electrodes or p-electrodes 26 make contact with the exposed surfaces of the light-emitting regions 21. The underside of the semiconductor substrate 11 is covered by a common second-conductive-type electrode or n-electrode 27.

Figure 2:
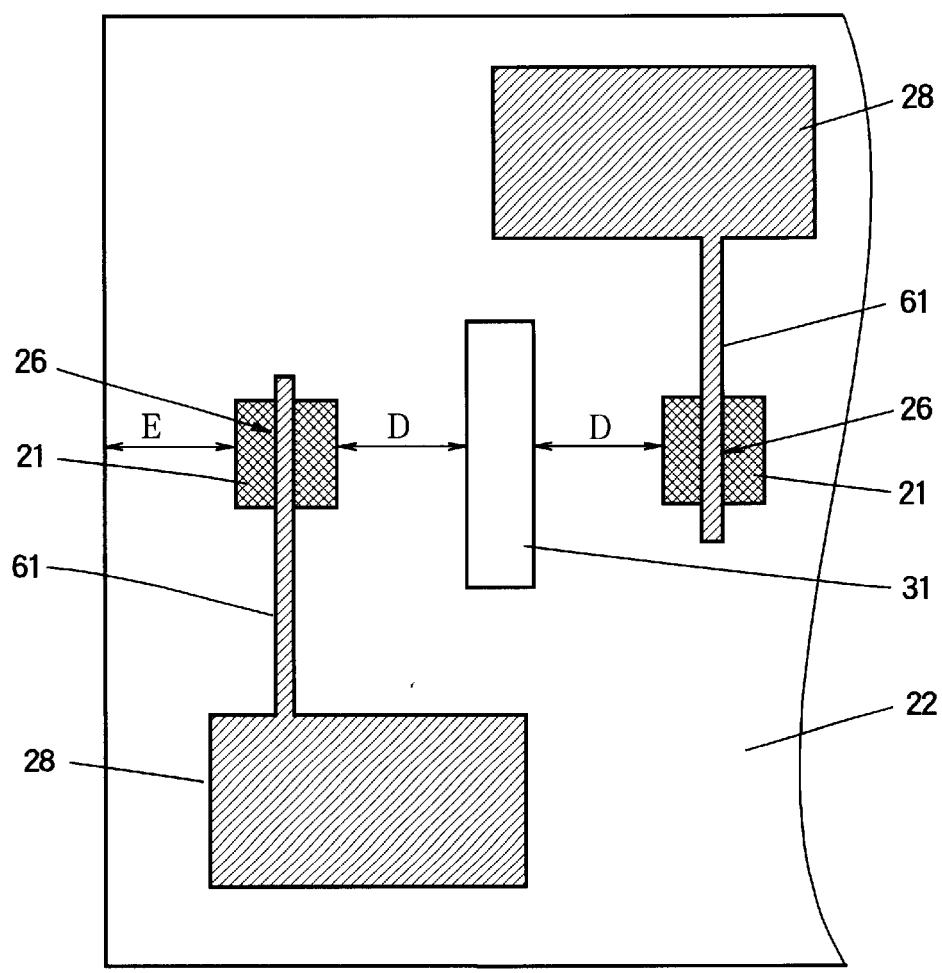
FIG. 2 is a plan view illustrating the first embodiment.

Referring to FIG. 2, each light-emitting region 21 has a p-electrode bonding pad 28, which is electrically coupled to the p-electrode 26 by a p-electrode lead 61. The p-electrode 26, its lead 61, and the bonding pad 28 may be formed as a single unit of the same material, as shown, or the bonding pad 28 may be formed separately. The p-electrode bonding pads 28 may be disposed on alternate sides of the array of light-emitting regions 21, as shown, or on just one side, as will be shown later.

The array may have any number of light-emitting regions 21, arranged in a row.

The emission-altering element in the first embodiment is a region in the semiconductor epitaxial layer 12 having a light-reduction trench 31. One light-reduction trench 31 is disposed between each pair of mutually adjacent light-emitting regions 21. As shown in FIG. 1, the trench 31 extends through the diffusion mask 22 and partway into the semiconductor epitaxial layer 12, and is separated from both adjacent light-emitting regions 21, making contact with neither of them. The distance D from the trench 31 to each adjacent light-emitting region 21 is preferably equal to the distance E from the edge of the chip to the light-emitting region 21 nearest the edge.

During operation, each light-emitting region 21 emits light by carrier recombination when a forward voltage is applied between the corresponding p-electrode 26 and the n-electrode 27. The voltage is applied through a bonding wire (not visible) attached to the p-electrode bonding pad 28. Light emission from the light-emitting region 21 at each end of the array is reduced by proximity to the edge of the chip, but light emission from the light-emitting regions 21 in the interior of the array is also reduced, by substantially the same amount, by the presence of the trenches 31. Consequently, all light-emitting regions 21 in the array emit the same amount of light.

A more detailed description of the first embodiment will now be given, starting with a description of the fabrication process. It will be assumed that the fabrication process is carried out on a wafer in which the semiconductor epitaxial layer 12 has already been formed on the semiconductor substrate 11. At the end of the process, the wafer is diced into chips, each chip becoming a separate LED array. The drawings will show only one part of one chip.

An example of the type of wafer that can be used is a wafer with an n-type gallium arsenide (GaAs) semiconductor substrate 11 and an n-type aluminum gallium arsenide (AlGaAs) epitaxial layer 12. Use of this type of wafer will be assumed below. The invention is not limited to these wafer materials, however. Wafers with an epitaxial layer of gallium arsenide phosphide (GaAsP), for example, are also known and may be used.

Figure 3A:
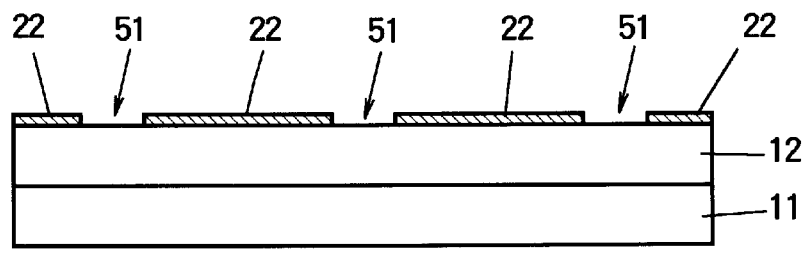
FIGS. 3A to 3H are sectional views illustrating steps in a fabrication process for the first embodiment.

Referring to FIG. 3A, fabrication begins with the formation of the diffusion mask 22 on the semiconductor epitaxial layer 12. The diffusion mask 22 comprises silicon nitride (SiN), for example, which can be deposited by chemical vapor deposition (CVD), then patterned by photolithography and etching. The patterning creates windows 51 that define what will become the light-emitting regions.

Figure 3B:
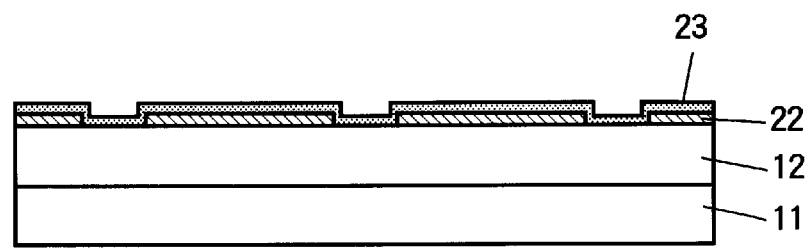

Referring to FIG. 3B, a diffusion source film 23 is next deposited on the entire surface of the wafer. The diffusion source film 23 comprises, for example, zinc oxide and silicon dioxide (ZnO—SiO$_2$), which can be deposited by sputtering.

Figure 3C:
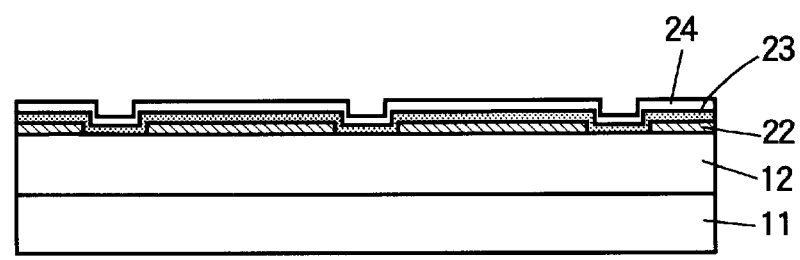

Referring to FIG. 3C, an anneal cap 24 is deposited on the diffusion source film 23. The anneal cap 24 is, for example, a film of aluminum nitride (AlN), which can also be deposited by sputtering.

Figure 3D:
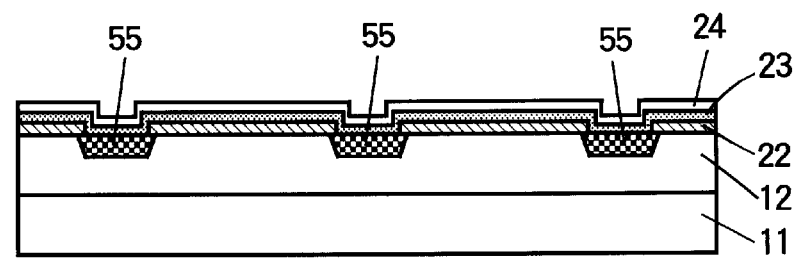

Referring to FIG. 3D, the wafer is now annealed, causing a p-type impurity such as zinc to diffuse from the diffusion source film 23 through the windows in the diffusion mask 22, forming p-type diffusion regions 55 with a controlled depth in the semiconductor epitaxial layer 12. If the materials mentioned above are used, annealing in a nitrogen atmosphere for three hours at 650° C. produces diffusion regions 55 with a depth of substantially one micrometer (1 $\mu$m).

Figure 3E:
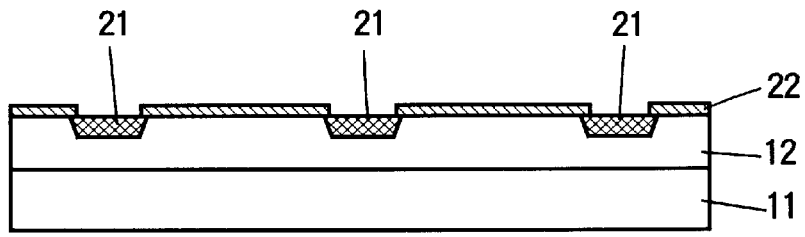

Referring to FIG. 3E, following annealing, the diffusion source film and anneal cap are removed, leaving the diffusion mask 22, and exposing the surfaces of the diffusion regions, which thus become light-emitting regions 21. The diffusion source film and anneal cap can be removed by etching with an etchant that does not etch the diffusion mask 22 and semiconductor epitaxial layer 12.

Figure 3F:
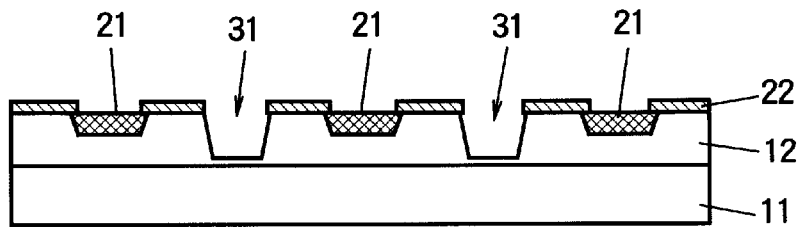
Figure 4A:
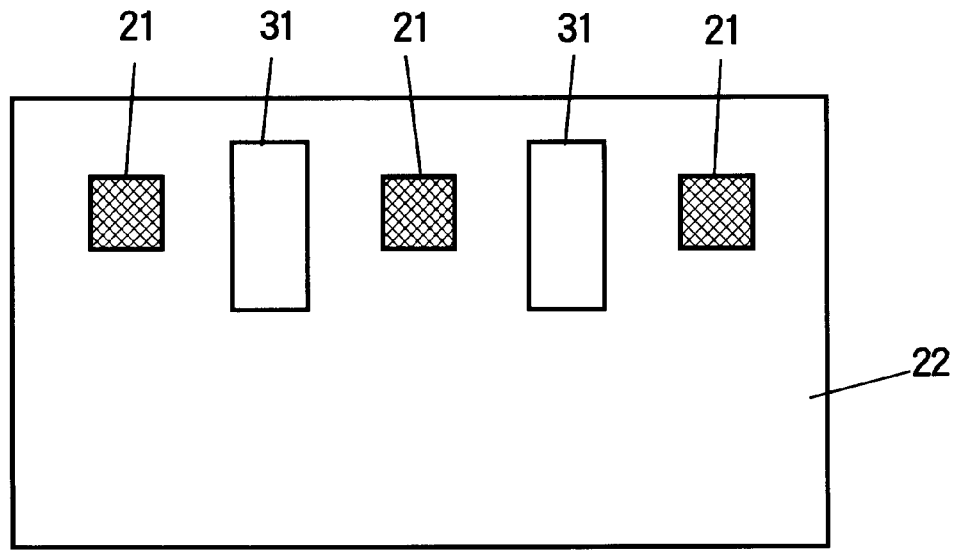
FIGS. 4A and 4B are plan views illustrating the steps in FIGS. 3F and 3G, respectively.

Referring to FIG. 3F, a light-reduction trench 31 is now formed between each mutually adjacent pair of light-emitting regions 21. The trenches 31 can be formed by etching with, for example, a solution of phosphoric acid and hydrogen peroxide, using an etching mask (not shown) formed by photolithography. FIG. 4A shows a plan view of the array at this stage.

The length, width, and depth of the trenches 31 can be selected to obtain the desired reduction of the amount of emitted light. The trenches 31 are preferably at least as long as the light-emitting regions 21 in the direction perpendicular to the array direction (the vertical direction in FIG. 4A). The trenches 31 are preferably at least as deep as the light-emitting regions 21, but they must not be so wide as to make contact with the light-emitting regions 21. Since the depth and width of the trenches 31 both increase as etching progresses, the depth may be limited by the width constraint.

Figure 3G:
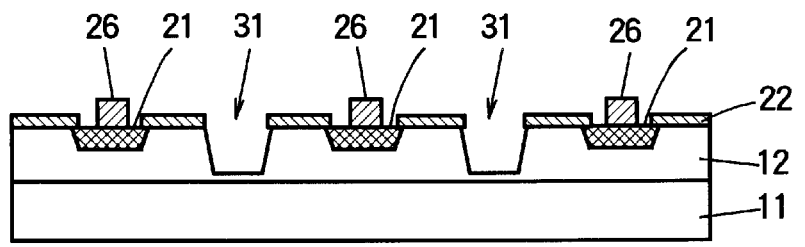
Figure 4B:
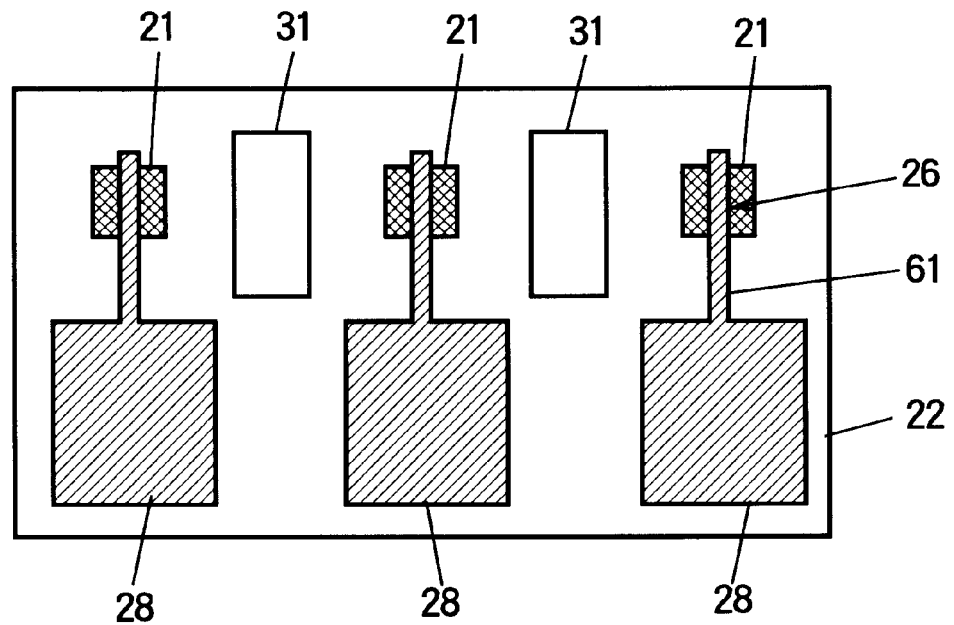

Referring to FIGS. 3G and 4B, the p-electrodes 26, p-electrode bonding pads 28, and p-electrode leads 61 are now formed by depositing and patterning a conductive film such as a film of aluminum (Al), or a multi-layer film including gold (Au). The lift-off method, for example, can be used to form these electrodes 26, bonding pads 28, and leads 61 in a single step. Alternatively, the electrodes 26 and leads 61 may be formed in a single step, and the bonding pads 28 in a later step. Here, all of the bonding pads 28 are shown formed on the same side of the array, although they may be disposed on alternate sides, as was shown earlier.

Figure 3H:
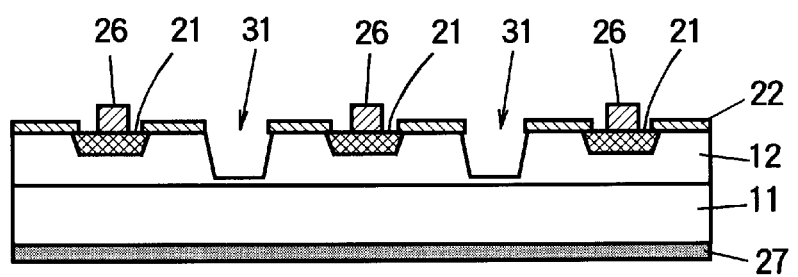

Referring to FIG. 3H, the n-electrode 27 is formed by depositing, for example, a gold alloy film on the underside of the wafer. An alloy of gold, germanium, and nickel (Au—Ge—Ni) can be used. Following this step, the wafer is diced into chips.

Figure 5A:
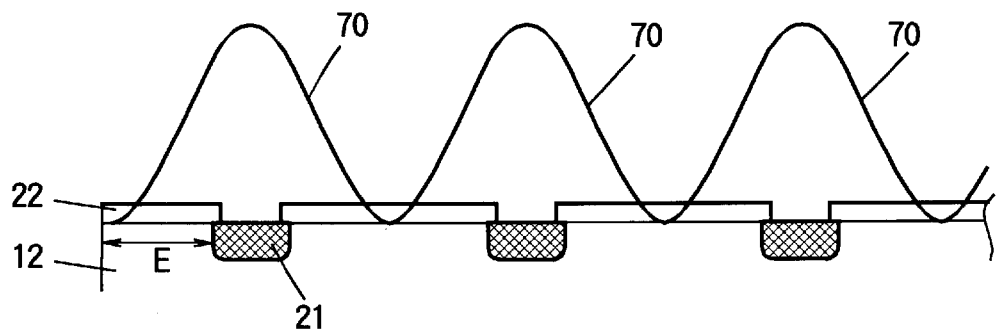
FIGS. 5A, 5B, and 5C illustrate light intensity profiles in various conventional LED arrays.

To explain the effect of the first embodiment, it is useful to begin by considering a conventional LED array not having light-reduction trenches 31. FIG. 5A shows a simplified sectional view of such an array, using the same reference numerals as above for the semiconductor epitaxial layer 12, light-emitting regions 21, and diffusion mask 22. The curves 70 are light intensity profiles, representing the amount of light emitted from the surface of the array around each light-emitting region 21. If the distance E from the outermost light-emitting regions 21 in the array to the adjacent edges of the chip is sufficiently large, then the intensity profiles 70 of all of the light-emitting regions 21 have the same shape, as shown.

Figure 5B:
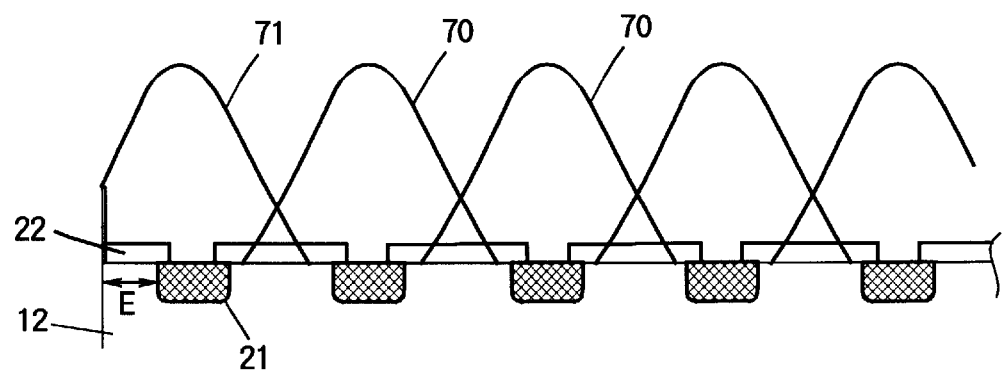
Figure 5C:
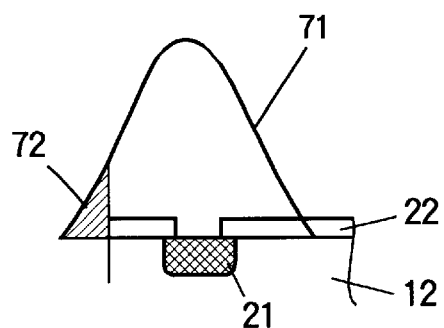

If the density of the array is increased, however, this distance E may be reduced to the point that the intensity profile 71 of the light-emitting region 21 next to each edge is truncated, as shown in FIG. 5B. That is, the part 72 indicated by hatching in FIG. 5C is eliminated. Accordingly, the two outermost light-emitting regions 21 in the array emit less light than the interior light-emitting regions 21.

Figure 6:
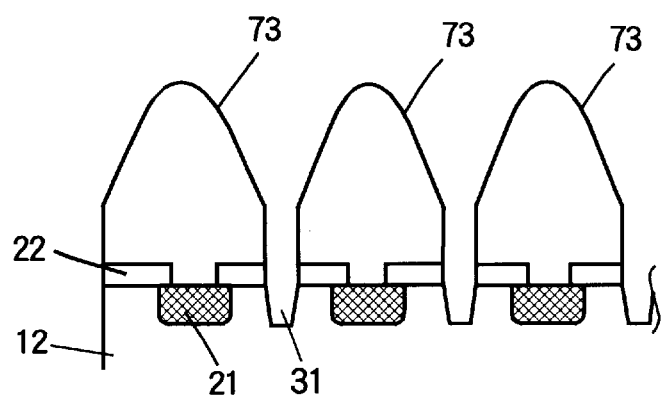
FIG. 6 illustrates light intensity profiles in the first embodiment.

FIG. 6 shows the corresponding intensity profiles 73 in the first embodiment. Due to the light-reduction trenches 31, all of the intensity profiles 73 are truncated equally on both sides, all of the intensity profiles 73 have the same shape, and all of the light-emitting regions 21 emit the same amount of light.

Figure 7:
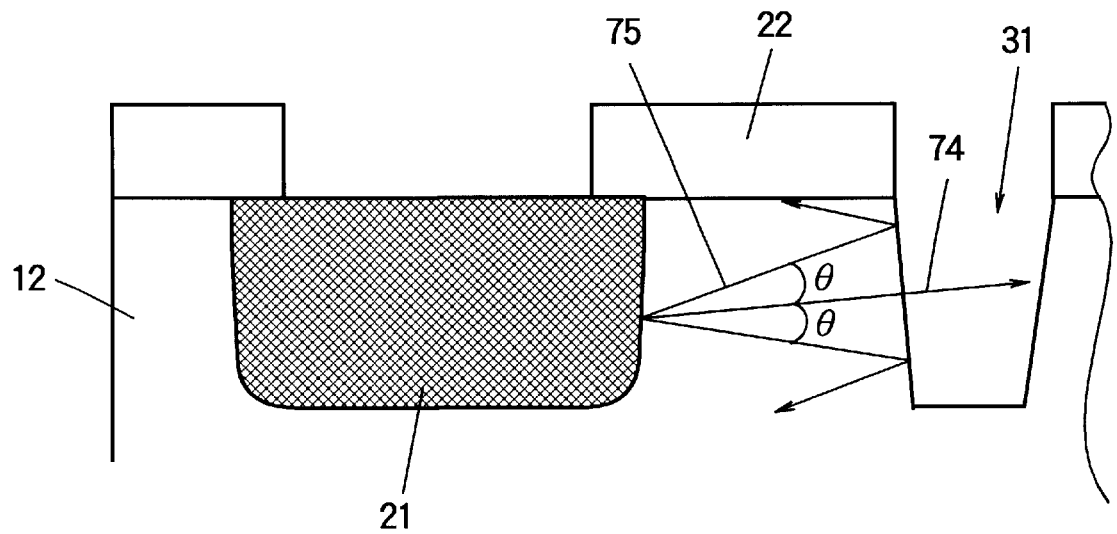
FIG. 7 illustrates internal reflection of light rays in the first embodiment.

FIG. 7 indicates schematically how light emission is truncated by the trenches 31. A light ray 74 emitted toward the trench 31 in a direction substantially perpendicular to the trench wall passes through the wall, but is traveling at too low an angle to be emitted from the surface of the chip in the vicinity of the light-emitting region 21. A light ray 75 traveling at a higher angle, however, is internally reflected by the wall of the trench 31. Snell's law and the refractive index of the semiconductor epitaxial layer 12 imply that internal reflection occurs when the angle of incidence $\theta$ with respect to the wall of the trench 31 is greater than eighteen degrees (18°). Thus most of the light that would have been emitted in the area occupied by the trench 31, if the trench 31 were not present, undergoes internal reflection instead.

Figure 8:
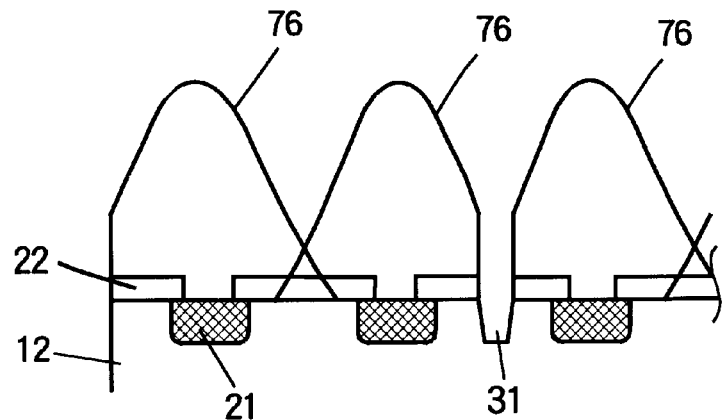
FIG. 8 illustrates light intensity profiles in a variation of the first embodiment.

FIG. 8 illustrates a variation of the first embodiment in which light-reduction trenches 31 are formed between every second pair of mutually adjacent light-emitting regions 21, instead of between every pair, so that the intensity profile 76 of the light emitted by each light-emitting region 21 is truncated on just one side. All of the intensity profiles 76 still have the same shape, so all light-emitting regions 21 emit the same amount of light.

Figure 9:
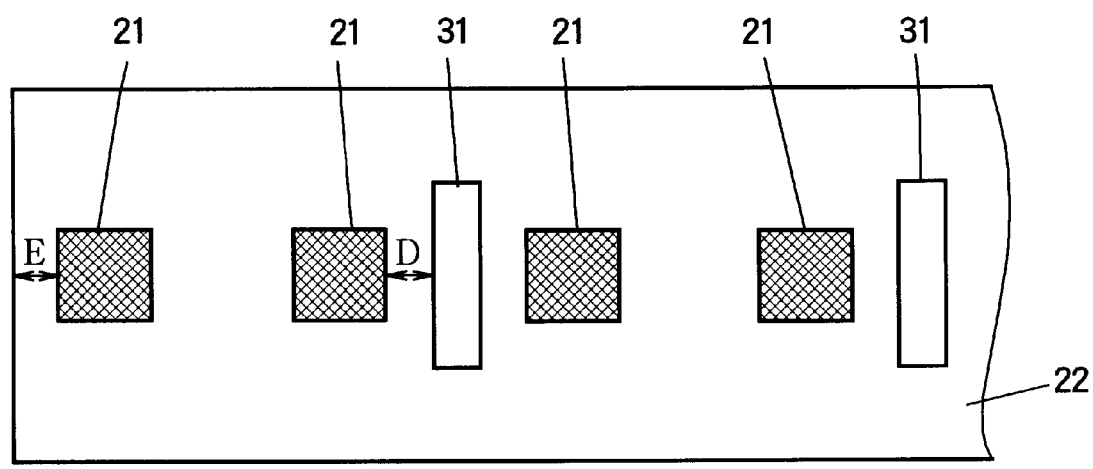
FIG. 9 is a plan view of this variation of the first embodiment.

FIG. 9 shows a plan view of this variation. As before, the distance E from the edge of the chip to the nearest light-emitting region 21 is preferably equal to the distance D from each light-reduction trench 31 to the nearest light-emitting regions 21.

This variation has the advantage of causing only half as much reduction in light emission, because each intensity profile is truncated on only one side.

Figure 10:
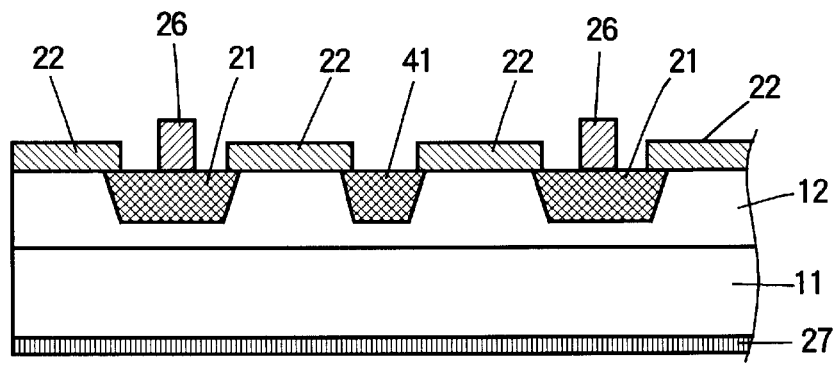
FIG. 10 is a sectional view of an LED array illustrating a second embodiment.
Figure 11:
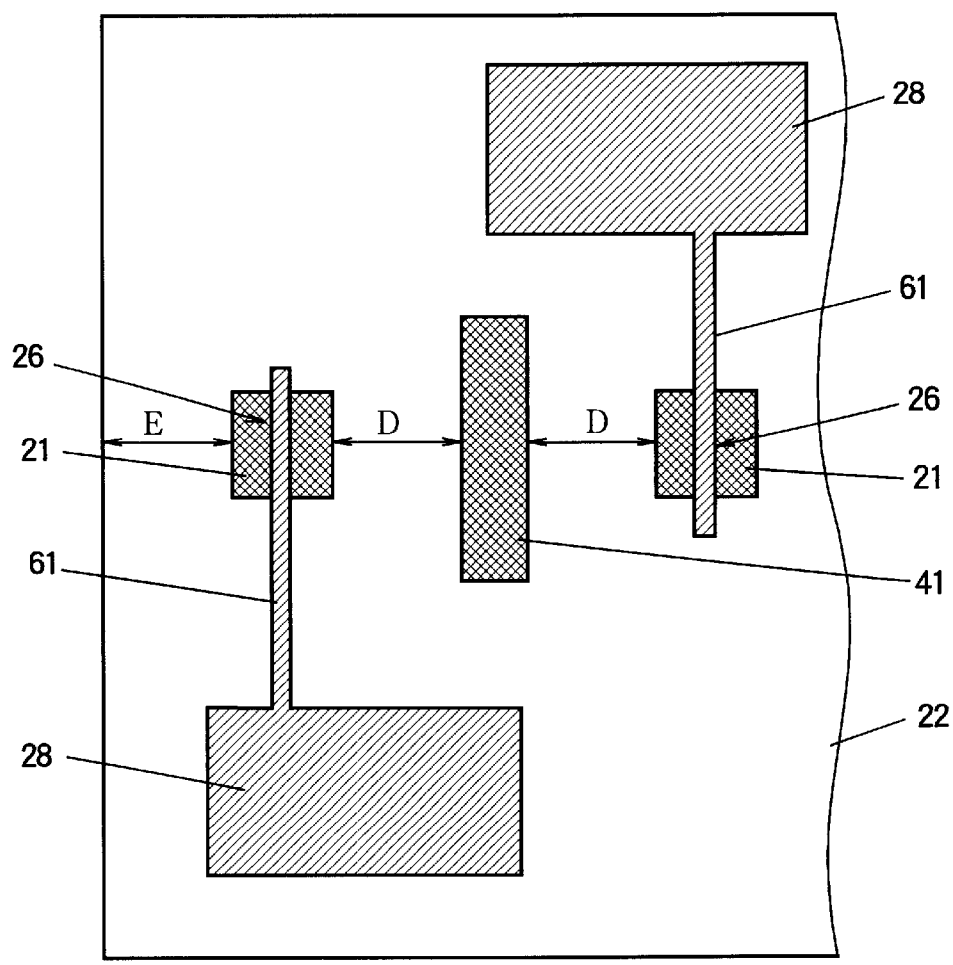
FIG. 11 is a plan view illustrating the second embodiment.

Referring to FIG. 10, the second embodiment replaces the light-reduction trenches of the first embodiment with non-emitting p-type regions 41. A non-emitting p-type region 41 is a p-type diffusion region similar to a light-emitting region 21, but has no electrode, receives no current, and emits no light. Referring to FIG. 11, each non-emitting p-type region 41 is disposed at equal distances D from the adjacent light-emitting regions 21, these distances D preferably being equal to the distance E from the edge of the chip to the nearest light-emitting region 21.

The semiconductor substrate 11, semiconductor epitaxial layer 12, diffusion mask 22, p-electrodes 26, n-electrode 27, p-electrode bonding pads 28, and p-electrode leads 61 are identical to the corresponding elements in the first embodiment, the semiconductor substrate 11 comprising n-type GaAs and the semiconductor epitaxial layer 12 comprising n-type AlGaAs.

The effect of the non-emitting p-type regions 41 is to increase the amount of light emitted from each adjacent light-emitting region 21. The reason is thought to be that the energy barrier at the pn junction between a non-emitting p-type region 41 and the semiconductor epitaxial layer 12 confines minority carriers injected from the light-emitting region 21, thereby increasing the minority carrier density in the part of the semiconductor epitaxial layer 12 between the light-emitting region 21 and non-emitting p-type region 41, thus increasing the probability of recombination and light emission in this area.

A fabrication process for the second embodiment will be described with reference to FIGS. 12A to 12G. Fabrication is carried out on a wafer as in the first embodiment.

Figure 12A:
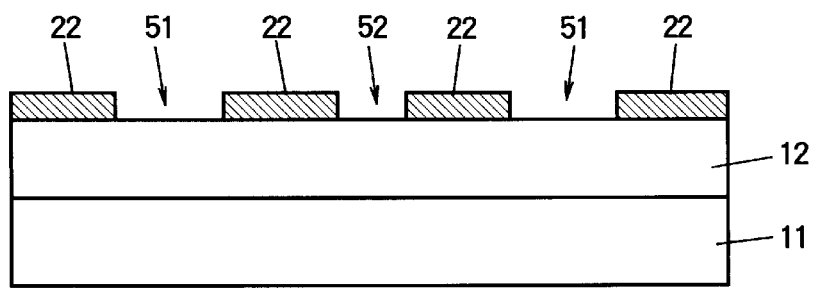
FIGS. 12A to 12G are sectional views illustrating steps in a fabrication process for the second embodiment.

Referring to FIG. 12A, fabrication begins with the formation of a diffusion mask 22 of silicon nitride, for example, on the semiconductor epitaxial layer 12. Photolithography and etching are used to create windows 51 that will define the light-emitting regions, and further windows 52 that will define the non-emitting p-type regions.

Figure 12B:
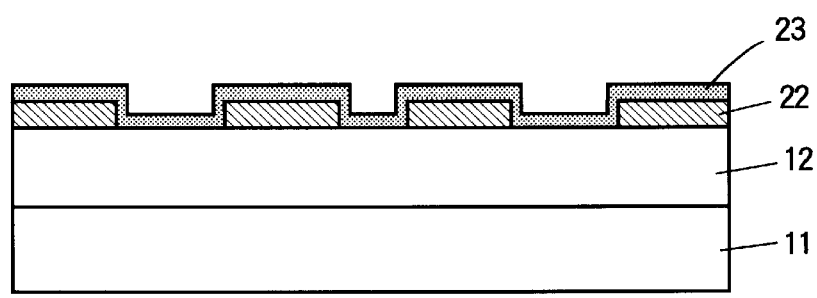

Referring to FIG. 12B, a diffusion source film 23 of ZnO—SiO$_2$, for example, is deposited by sputtering.

Figure 12C:
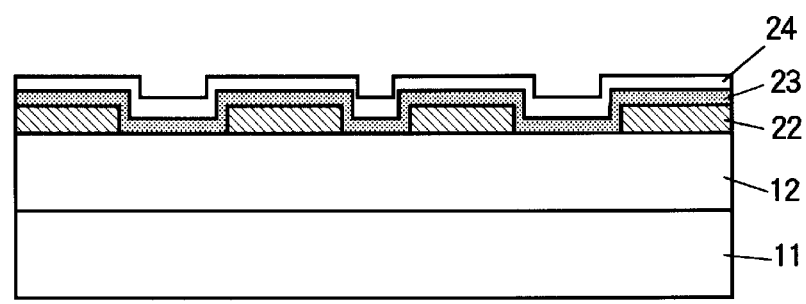

Referring to FIG. 12C, an anneal cap 24 of aluminum nitride, for example, is deposited on the diffusion source film 23 by sputtering.

Figure 12D:
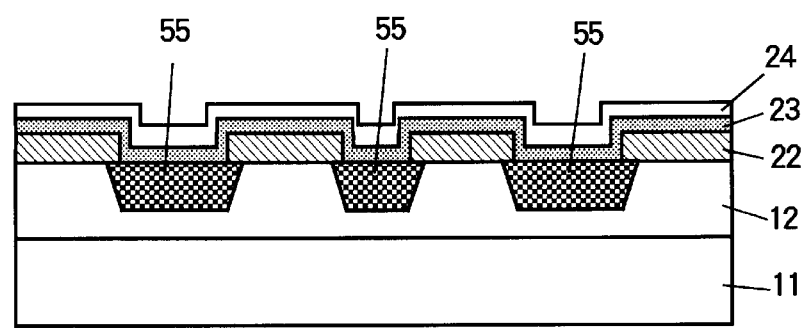

Referring to FIG. 12D, the wafer is annealed, causing a p-type impurity (e.g., zinc) to diffuse through the windows in the diffusion mask 22, forming p-type diffusion regions 55. The same annealing conditions as in the first embodiment can be used.

Figure 12E:
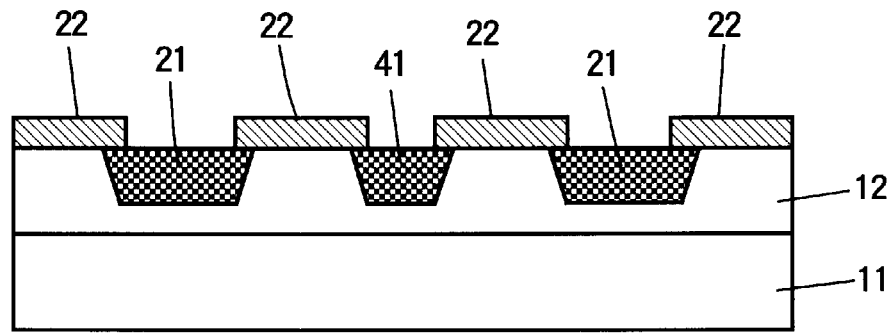

Referring to FIG. 12E, the diffusion source film and anneal cap are removed, by etching, for example, leaving the diffusion mask 22. The diffusion regions thus become the light-emitting regions 21 and non-emitting p-type regions 41.

Figure 12F:
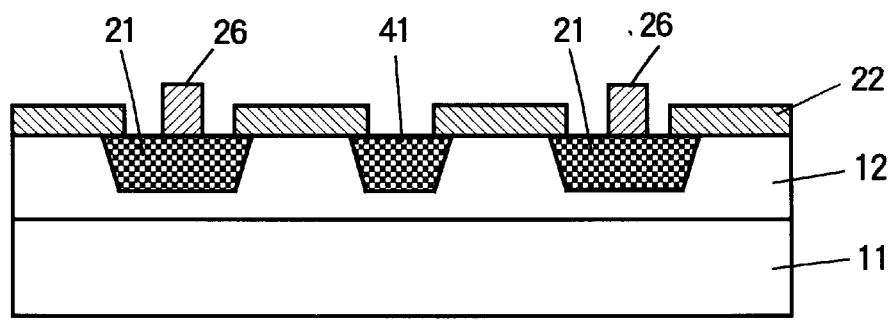

Referring to FIG. 12F, the p-electrodes 26 are now formed by depositing and patterning a conductive film such as an aluminum film, or a multi-layer film including gold. The lift-off method of patterning can be employed. The p-electrode bonding pads 28 and p-electrode leads 61 (not visible) may also be formed in this step. Alternatively, the p-electrodes 26 and p-electrode leads 61 may be formed in this step, and the p-electrode bonding pads 28 in a later step.

Figure 12G:
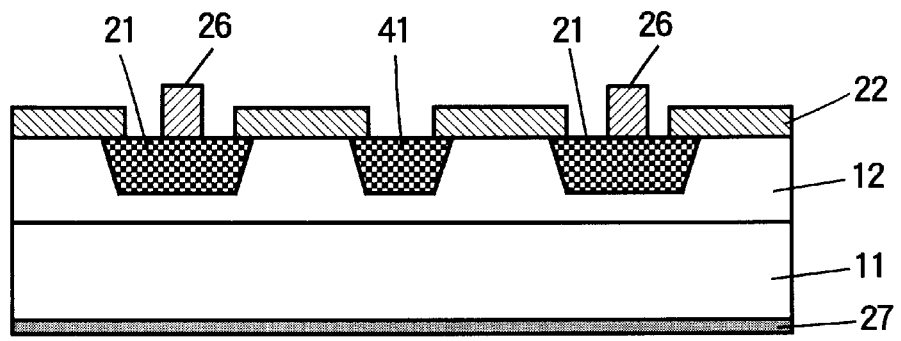

Referring to FIG. 12G, the n-electrode 27 is formed by depositing a gold alloy film, for example, on the underside of the wafer. The wafer is then diced into chips, completing the fabrication process.

The second embodiment does not solve the problem of less light being emitted from the light-emitting regions 21 at the two ends of the array. In a comparatively low-density array such as the one in FIG. 5A, however, in which this problem does not exist, the second embodiment can usefully increase the amount of light emitted by all of the light-emitting elements. The increase is obtained at no additional cost, since no additional fabrication steps are required.

The third embodiment is an LED array with a multi-layer wiring matrix. Differing from the preceding embodiments, this LED array is divided into blocks, each having a separate n-electrode.

Figure 13:
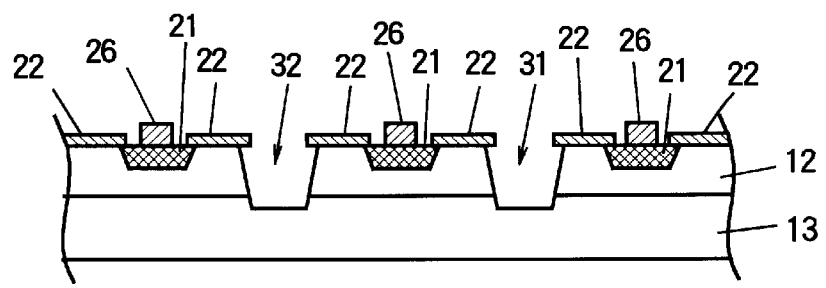
FIG. 13 is a sectional view of an LED array with multi-layer wiring, illustrating a third embodiment.

Referring to FIG. 13, the third embodiment has a high-resistance substrate 13, such as a semi-insulating GaAs layer, on which an epitaxial semiconductor layer 12 of the first conductive type, such as an n-type AlGaAs layer, is grown. Light-emitting regions 21 of the second conductive type are disposed in the semiconductor epitaxial layer 12, beneath windows in a diffusion mask 22, as in the preceding embodiments. Light-reduction trenches 31 are formed between some pairs of light-emitting regions 21, and isolation trenches 32 are formed between other pairs of light-emitting regions 21. The isolation trenches 32 extend completely through the semiconductor epitaxial layer 12 and partly into the high-resistance substrate 13. The light-reduction trenches 31 may also extend into the high-resistance substrate 13, as illustrated. The light-reduction trenches 31 and isolation trenches 32 preferably have identical widths. One trench 31 or 32 is disposed between each pair of mutually adjacent light-emitting regions 21.

Figure 14:
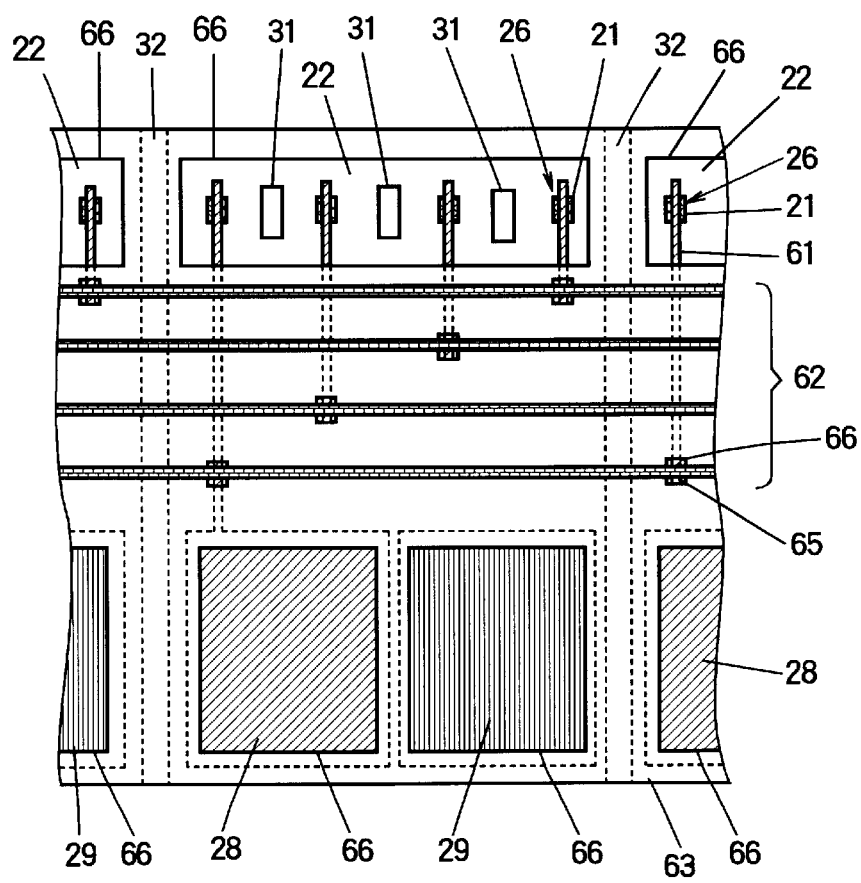
FIG. 14 is a plan view illustrating the third embodiment.

Referring to FIG. 14, the isolation trenches 32 extend clear across the upper surface of the chip, dividing the semiconductor epitaxial layer into electrically isolated blocks. The light-reduction trenches 31 are comparatively short, and do not divide the semiconductor epitaxial layer into electrically isolated blocks. The light-reduction trenches 31 should be at least as long as the light-emitting regions 21, however.

There are two wiring layers. The lower wiring layer includes p-electrodes 26, p-electrode bonding pads 28, and p-electrode leads 61, generally as described in the first embodiment, and also includes one n-electrode pad 29 per block. The n-electrode pad 29 functions as both an electrode and a bonding pad. The upper wiring layer includes a plurality of common interconnecting lines 62 that extend parallel to the array, interconnecting the p-electrode leads 61. The two wiring layers are separated by an inter-layer dielectric film 63. Contacts 65 between the p-electrode leads 61 and common interconnecting lines 62 are formed in windows 66 in the inter-layer dielectric film 63, which also has windows 66 exposing the p-electrode bonding pads 28, the n-electrode pads 29, and the light-emitting regions 21.

The number of common interconnecting lines 62 is equal to the number of light-emitting regions 21 per block. Each common interconnecting line 62 makes contact with one p-electrode lead 61 in each block. Instead of there being one p-electrode bonding pad 28 for each light-emitting region 21, there only needs to be at least one p-electrode bonding pad 28 for each common interconnecting line 62.

A particular light-emitting region 21 is driven by applying a forward voltage between the n-electrode pad 29 in the same block, and the p-electrode bonding pad 28 to which the light-emitting region 21 is coupled by the electrode leads 61 and interconnecting lines 62. The advantage of this matrix driving scheme is that by reducing the necessary number of bonding pads, it reduces the chip size, enabling more chips to be fabricated from a single wafer, thereby lowering the cost per chip. Wire-bonding costs are also lowered, since there are fewer wires to be bonded, and only one driving integrated circuit (driver IC) is required, since all the bonding pads to be driven are disposed on the same side of the array chip.

Figure 15:
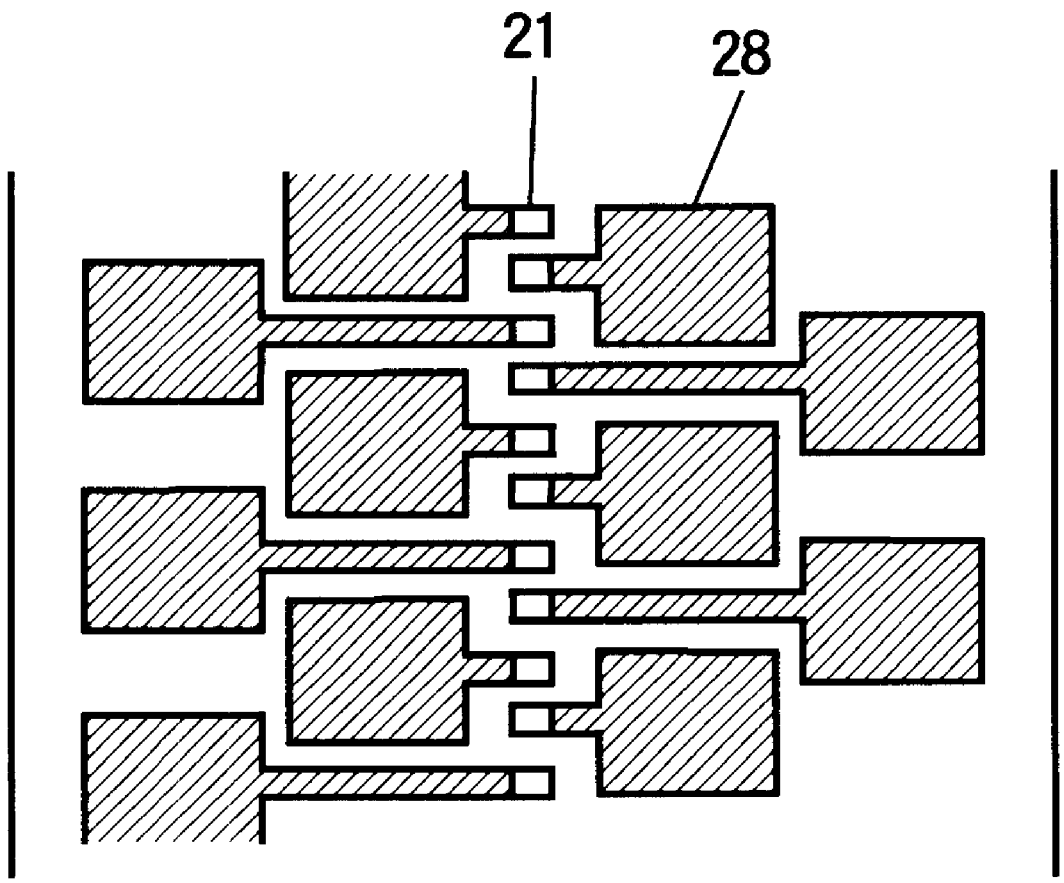
FIG. 15 is a plan view of part of a conventional LED array.

When a high-resolution LED array has one bonding pad 28 per light-emitting region 21, if the bonding pads 28 are large enough for easy attachment of bonding wires, they often have to be disposed on both sides of the array, as shown in FIG. 15, for example. This arrangement requires two driver ICs per LED array chip.

Next, a fabrication process for the third embodiment will be described.

Figure 16A:
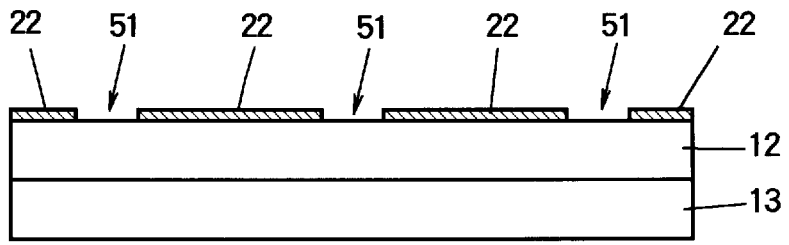
FIGS. 16A to 16F are sectional views illustrating steps in a fabrication process for the third embodiment.

Referring to FIG. 16A, fabrication begins with the formation of a diffusion mask 22 of silicon nitride, for example, on the semiconductor epitaxial layer 12. Photolithography and etching are used to form windows 51 that will define the light-emitting regions.

Figure 16B:
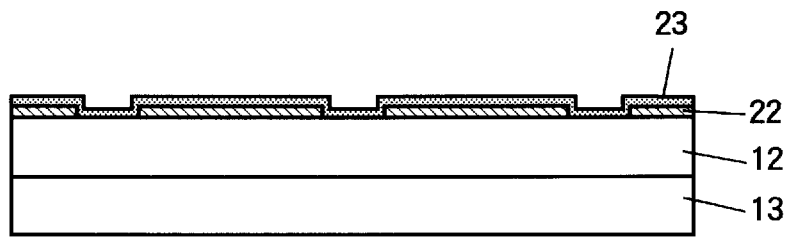

Referring to FIG. 16B, a diffusion source film 23 comprising ZnO—SiO$_2$, for example, is deposited by sputtering.

Figure 16C:
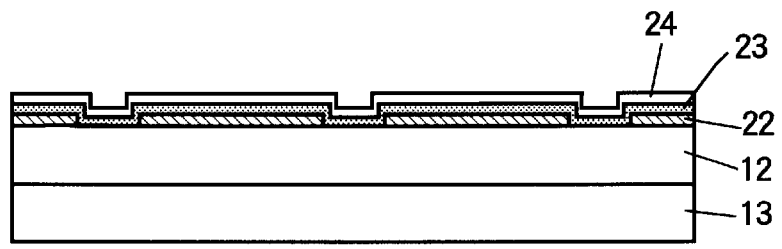

Referring to FIG. 16C, an anneal cap 24 of aluminum nitride, for example, is deposited by sputtering on the diffusion source film 23.

Figure 16D:
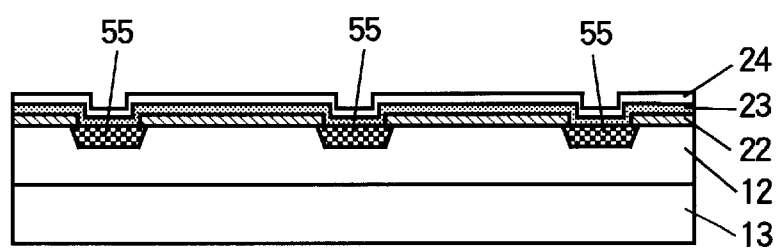

Referring to FIG. 16D, the wafer is now annealed, causing a p-type impurity (e.g., zinc) to diffuse through the windows in the diffusion mask 22, forming p-type diffusion regions 55 in the semiconductor epitaxial layer 12. The annealing conditions described in the first embodiment can be used to form diffusion regions 55 with a depth of substantially one micrometer (1 µm).

Figure 16E:
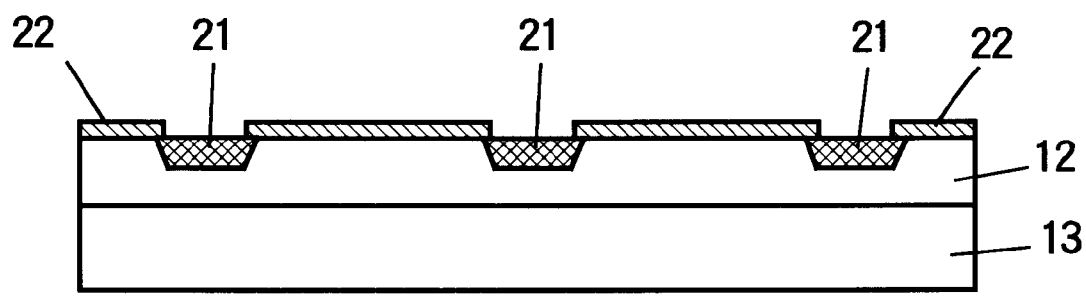

Referring to FIG. 16E, the diffusion source film and anneal cap are removed, leaving the diffusion mask 22. The diffusion regions thus become the light-emitting regions 21.

Figure 16F:
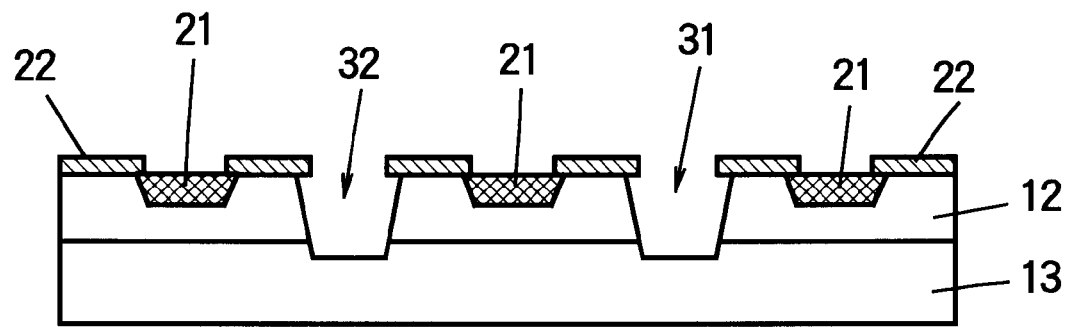

Referring to FIG. 16F, the light-reduction trenches 31 and isolation trenches 32 are formed by photolithography and etching. A solution of phosphoric acid and hydrogen peroxide can be used as the etchant. As noted above, the light-reduction trenches 31 and isolation trenches 32 preferably have the same width, but this width must not be so great that any of the trenches 31, 32 touch the light-emitting regions 21.

Figure 17A:
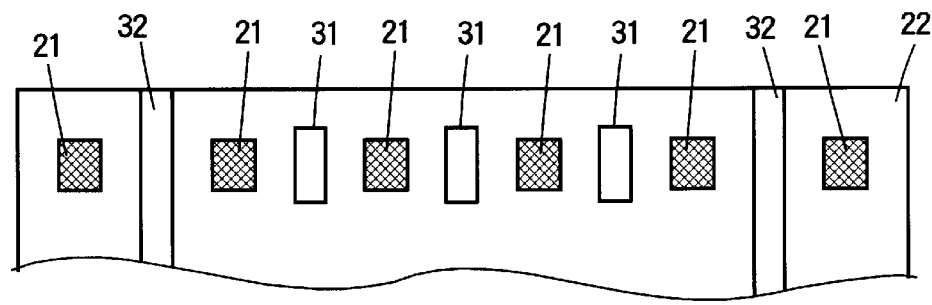
FIGS. 17A to 17E are plan views illustrating further steps in the fabrication process for the third embodiment.

FIG. 17A shows a plan view of the array at this stage. The light-reduction trenches 31 are preferably at least as long as the light-emitting regions 21. The length of the light-reduction trenches 31, and the width and depth of both the light-reduction trenches 31 and isolation trenches 32, can be selected to obtain the desired adjustment of the amount of emitted light.

Figure 17B:
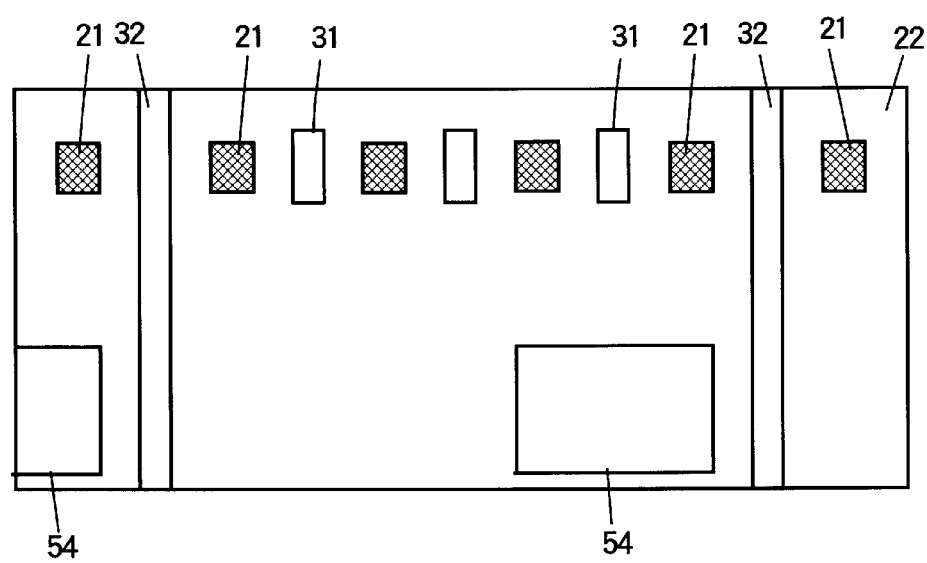

Referring to FIG. 17B, a further window 54 is now created in the diffusion mask 22 in each block, to accommodate the n-electrode that will be formed later. These windows 54 can be created by photolithography and etching.

Figure 17C:
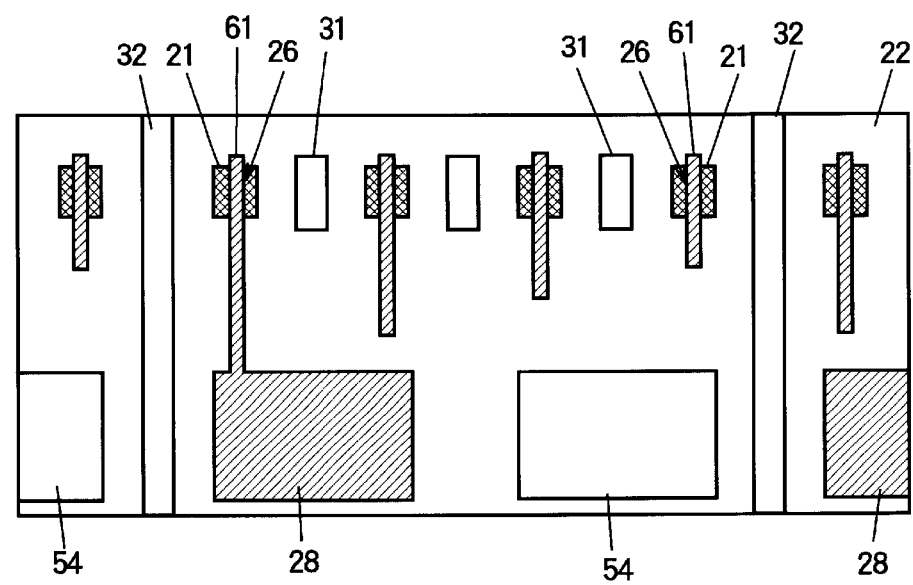

Referring to FIG. 17C, the p-electrodes 26, p-electrode bonding pads 28, and p-electrode leads 61 are now formed by depositing and patterning a conductive film such as a multi-layer gold film. The lift-off method of patterning can be used to form these electrodes 26, bonding pads 28, and leads 61 in a single step. Alternatively, the electrodes 26 and leads 61 can be formed in a single step and the bonding pads 28 in a later step.

Figure 17D:
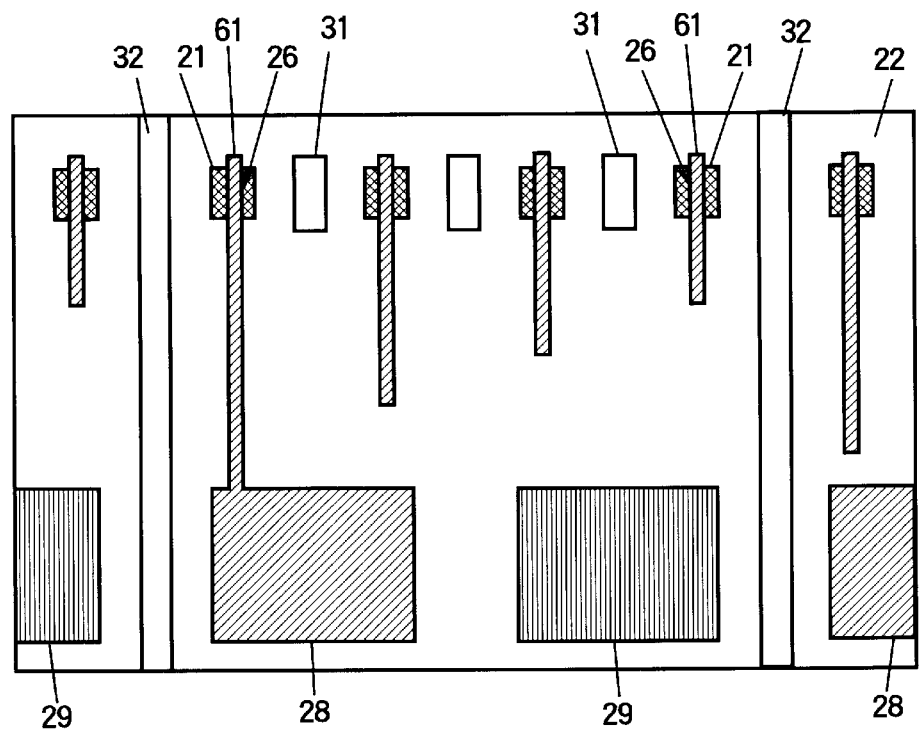

Referring to FIG. 17D, the n-electrode pads 29 are formed by depositing and patterning a conductive film such as a gold alloy film. The lift-off method can be employed.

The steps illustrated in FIGS. 17B, 17C, and 17D can be performed in various alternative sequences. For example, the p-electrodes 26, p-electrode bonding pads 28, and p-electrode leads 61 can be formed before the windows 54, or after the n-electrode pads 29.

Figure 17E:
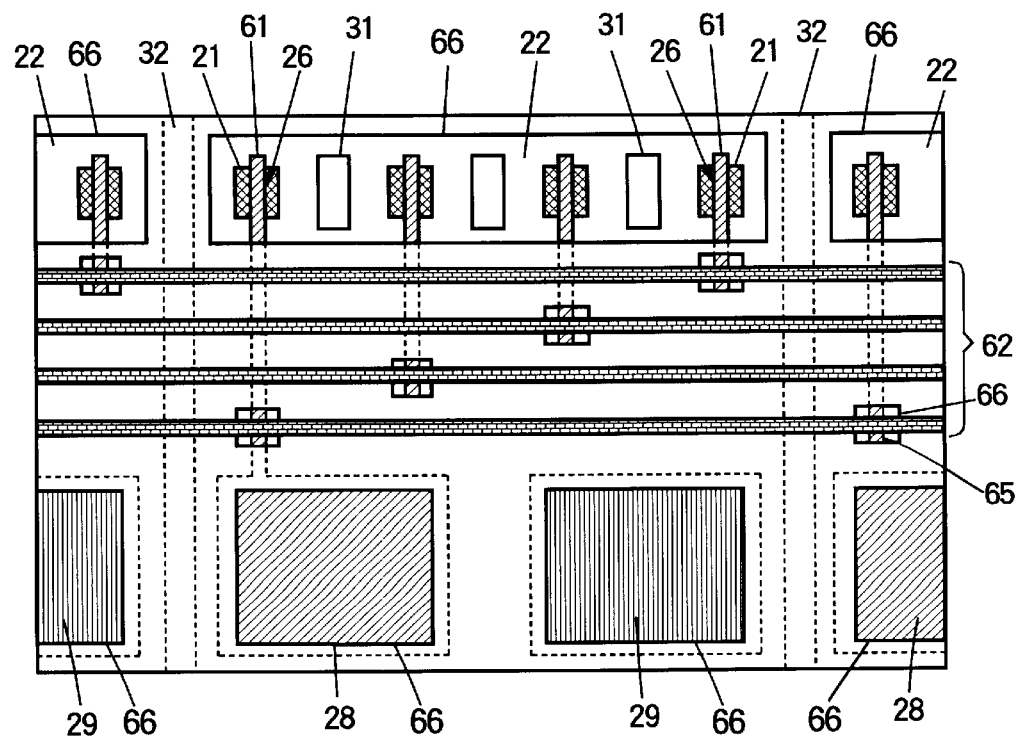

Referring to FIG. 17E, the inter-layer dielectric film 63 is formed by depositing and patterning a film of a dielectric material such as polyimide. The patterning is carried out by photolithography and etching to form the windows 66 for the light-emitting regions 21, p-electrode bonding pads 28, n-electrode pads 29, and contacts 65. The common interconnecting lines 62 are then formed by depositing and patterning a conductive metal film, using the lift-off patterning method, for example.

The light-reduction trenches 31 and isolation trenches 32 in the third embodiment have the same effect as the light-reduction trenches 31 in the first embodiment, truncating the intensity profiles of the light-emitting regions 21 so that all light-emitting regions 21 emit the same amount of light as the light-emitting regions 21 at the two ends of the array. This effect is obtained at no additional cost, since the light-reduction trenches 31 are formed in the same step as the isolation trenches 32 that provide isolation between the blocks.

Figure 18:
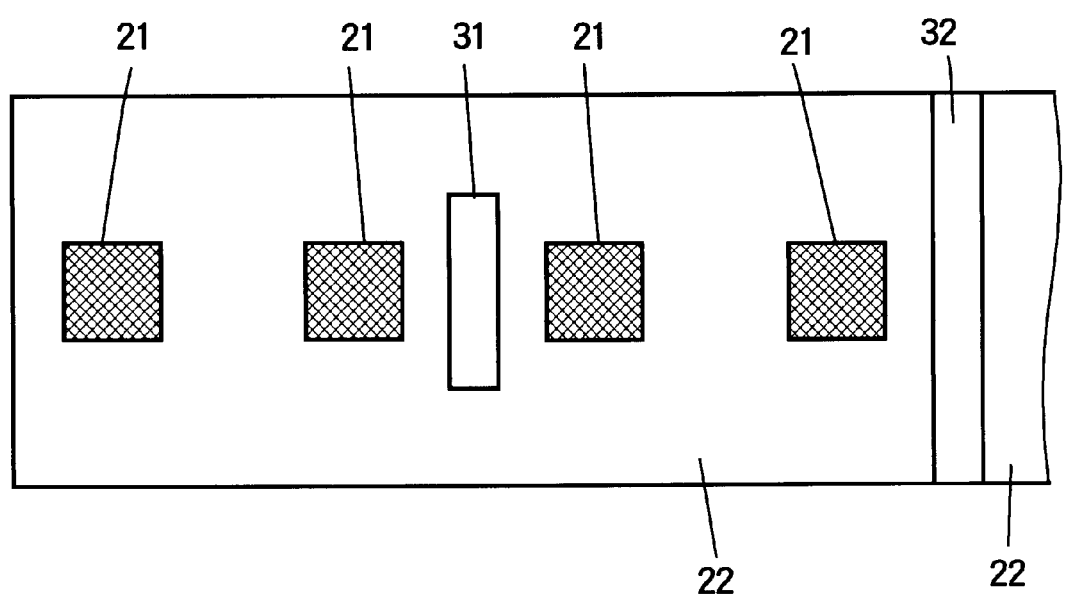
FIG. 18 is a plan view illustrating a variation of the third embodiment.

FIG. 18 schematically illustrates a variation of the third embodiment, showing the leftmost block of light-emitting regions 21 in the array, omitting the electrodes, electrode leads, and bonding pads. In this variation, each block has an even number of light-emitting regions 21. Light-reduction trenches 31 are disposed at intervals of two light-emitting regions 21 from the edges of the chip, from the isolation trenches 32, and if necessary from other light-reduction trenches 31, so that every light-emitting region 21 is adjacent to just one trench 31 or 32, or to an edge of the chip. With four light-emitting regions 21 per block, each block needs only one light-reduction trench 31, disposed in the center of the block. This variation has the same effect as the variation of the first embodiment illustrated in FIGS. 8 and 9, providing uniform light emission with less reduction in the amount of emitted light.

Next, a fourth embodiment will be described.

Figure 19:
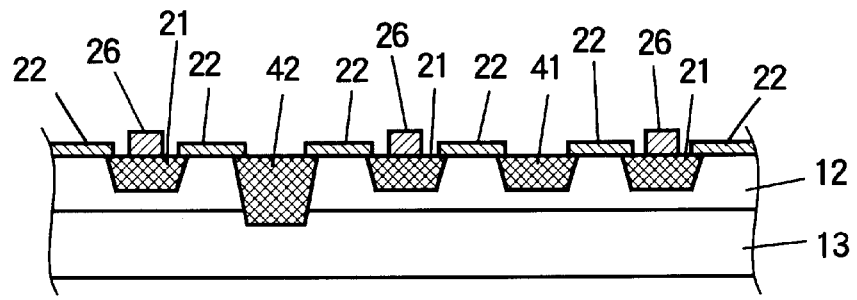
FIG. 19 is a sectional view of another LED array with multi-layer wiring, illustrating a fourth embodiment.

Referring to FIG. 19, the fourth embodiment replaces the light-reduction trenches of the third embodiment with non-emitting p-type regions 41, and replaces the isolation trenches with p-type isolation regions 42. The non-emitting p-type regions 41 are p-type diffusion regions that extend at least partway into the semiconductor epitaxial layer 12, as in the second embodiment. The p-type isolation regions 42 are p-type diffusion regions that extend completely through the semiconductor epitaxial layer 12 and may extend into the high-resistance substrate 13, dividing the semiconductor epitaxial layer 12 into electrically isolated blocks. Like the non-emitting p-type regions 41, the p-type isolation regions 42 lack electrodes and do not emit light.

The non-emitting p-type regions 41 are preferably at least as deep as the light-emitting regions 21, and not deeper than the p-type isolation regions 42. The fabrication process is simplified if the depth of the non-emitting p-type regions 41 is equal to either the depth of the light-emitting regions 21 (as illustrated) or the depth of the p-type isolation regions 42.

Figure 20:
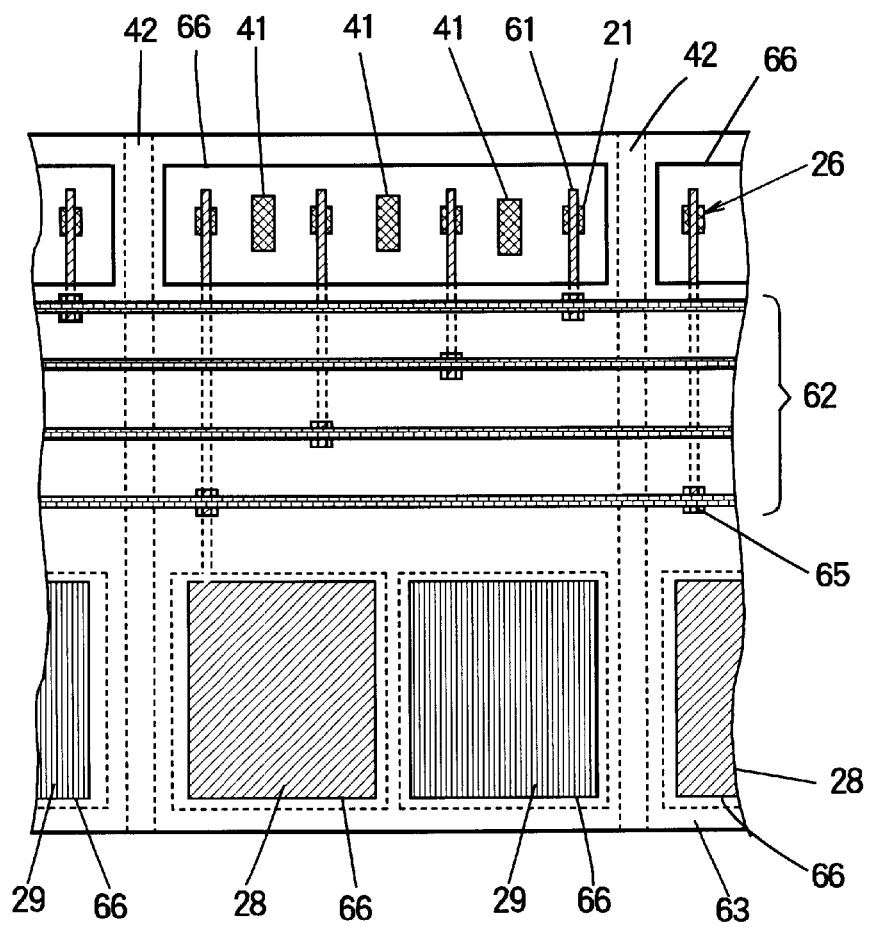
FIG. 20 is a plan view illustrating the fourth embodiment.

Referring to FIG. 20, the non-emitting p-type regions 41 and p-type isolation regions 42 may have substantially the same width and length dimensions as the corresponding trenches in the third embodiment.

The semiconductor epitaxial layer 12, high-resistance substrate 13, diffusion mask 22, p-electrodes 26, p-electrode bonding pads 28, n-electrode pads 29, p-electrode leads 61, common interconnecting lines 62, and inter-layer dielectric film 63 are identical to the corresponding elements in the third embodiment. The inter-layer dielectric film 63 has windows 66 as described in the third embodiment.

A fabrication process for the fourth embodiment will be described with reference to FIGS. 21A to 21F and 22A to 22E.

Figure 21A:
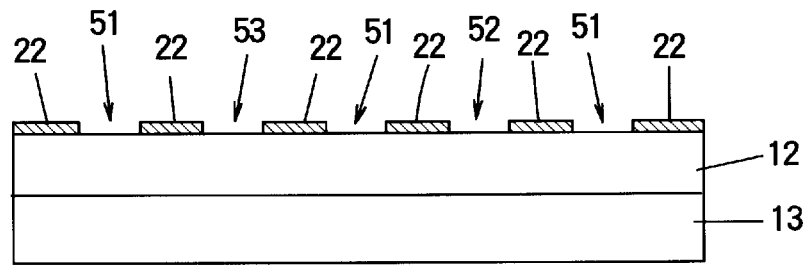
FIGS. 21A to 21F are sectional views illustrating steps in a fabrication process for the fourth embodiment.

Referring to FIG. 21A, fabrication begins with the formation of a diffusion mask 22 of silicon nitride, for example, on the semiconductor epitaxial layer 12. Photolithography and etching are used to create windows 51 that will define the light-emitting regions, windows 52 that will define the non-emitting p-type regions, and windows 53 that will define the p-type isolation regions.

Figure 21B:
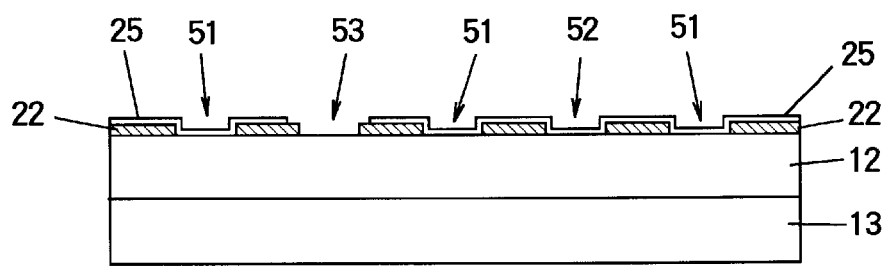

Next, referring to FIG. 21B, a diffusion control film 25 is deposited and patterned so as to cover windows 51 while exposing windows 53. In the present embodiment, the diffusion control film 25 also covers windows 52, so that the non-emitting p-type regions will have the same diffusion depth as the light-emitting regions. The embodiment can be varied by leaving windows 52 uncovered, in which case the non-emitting p-type regions will have the same diffusion depth as the p-type isolation regions. The diffusion control film 25 comprises, for example, a film of silicon nitride, which can be deposited by CVD and patterned by photolithography and etching.

Figure 21C:
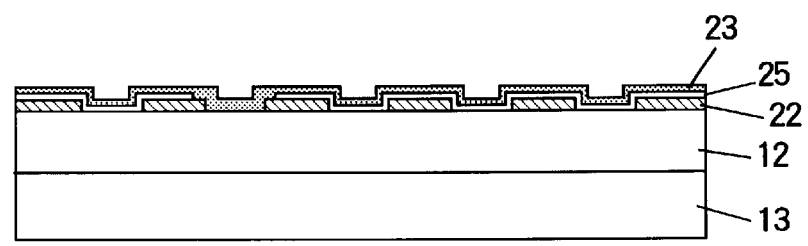

Referring to FIG. 21C, a diffusion source film 23 of ZnO—$SiO_2$, for example, is deposited by sputtering, covering the entire wafer surface.

Figure 21D:
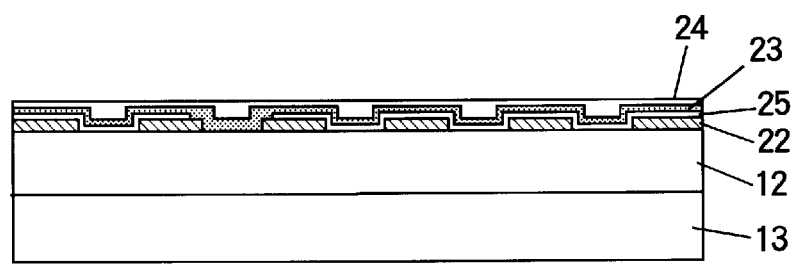

Referring to FIG. 21D, an anneal cap 24 of aluminum nitride, for example, is deposited on the diffusion source film 23 by sputtering.

Figure 21E:
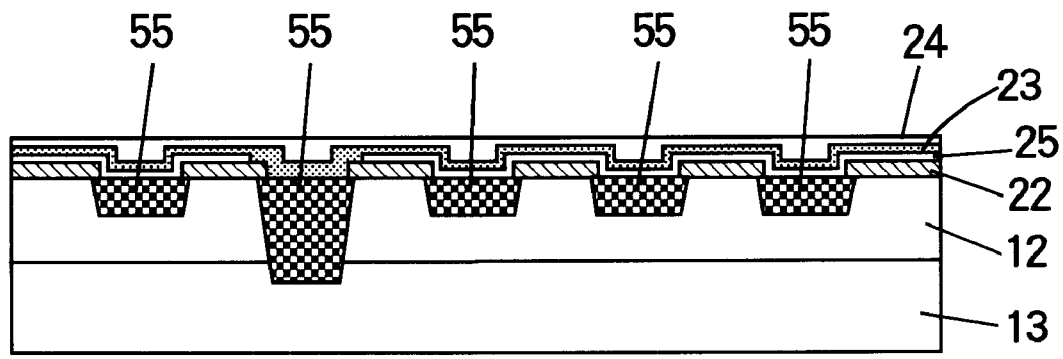

Referring to FIG. 21E, the wafer is annealed, causing a p-type impurity (e.g., zinc) to diffuse through the windows in the diffusion mask 22, forming p-type diffusion regions 55. The annealing can be performed in a nitrogen atmosphere at 700° C. for approximately five hours to form diffusion regions 55 with a depth of substantially 0.8 $\mu$m in the light-emitting regions and non-emitting p-type regions, and a depth of substantially 1.5 $\mu$m in the p-type isolation regions.

Figure 21F:
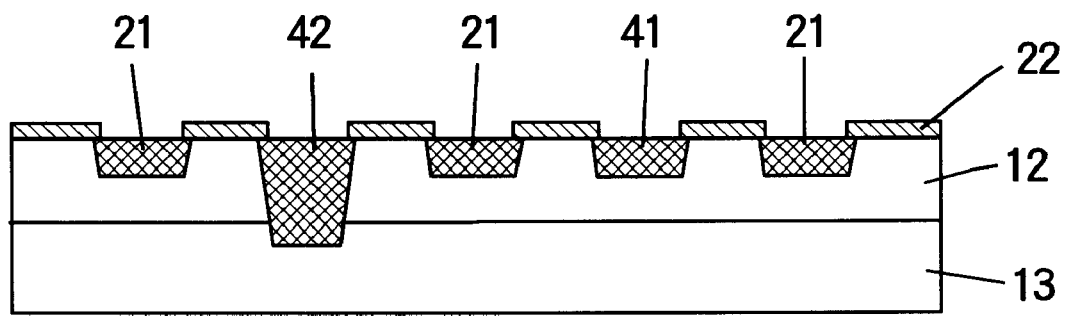
Figure 22A:
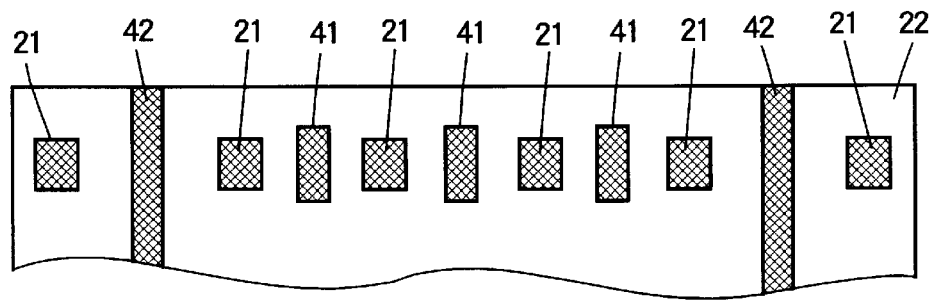
FIGS. 22A to 22E are plan views illustrating further steps in the fabrication process for the fourth embodiment.

Referring to FIG. 21F, the diffusion source film, anneal cap, and diffusion control film are now removed, by etching, for example, leaving the diffusion mask 22. The diffusion regions thus become the light-emitting regions 21, non-emitting p-type regions 41, and p-type isolation regions 42. FIG. 22A shows a plan view of the array at this stage in the fabrication process.

Figure 22B:
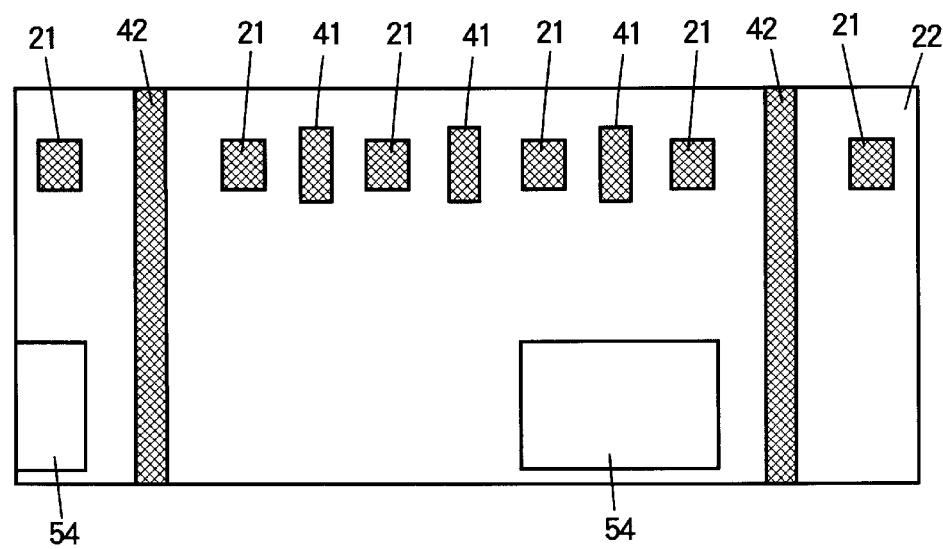
Figure 22C:
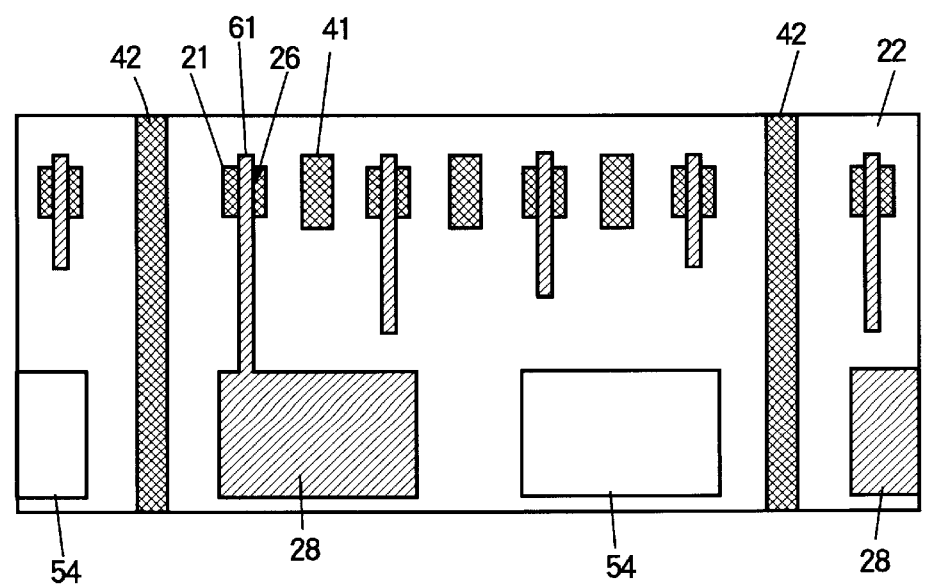
Figure 22D:
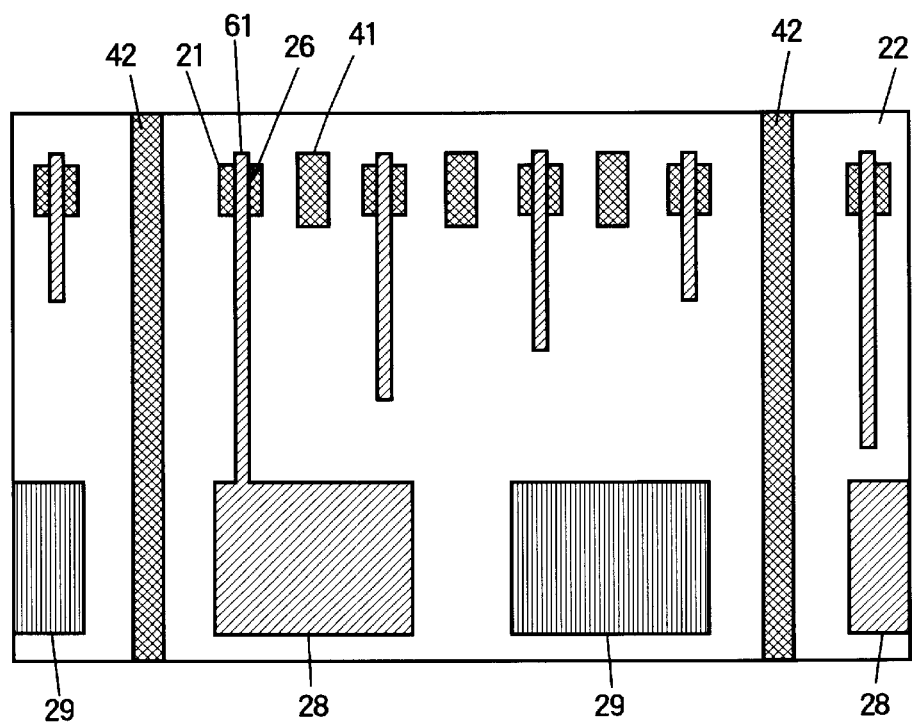
Figure 22E:
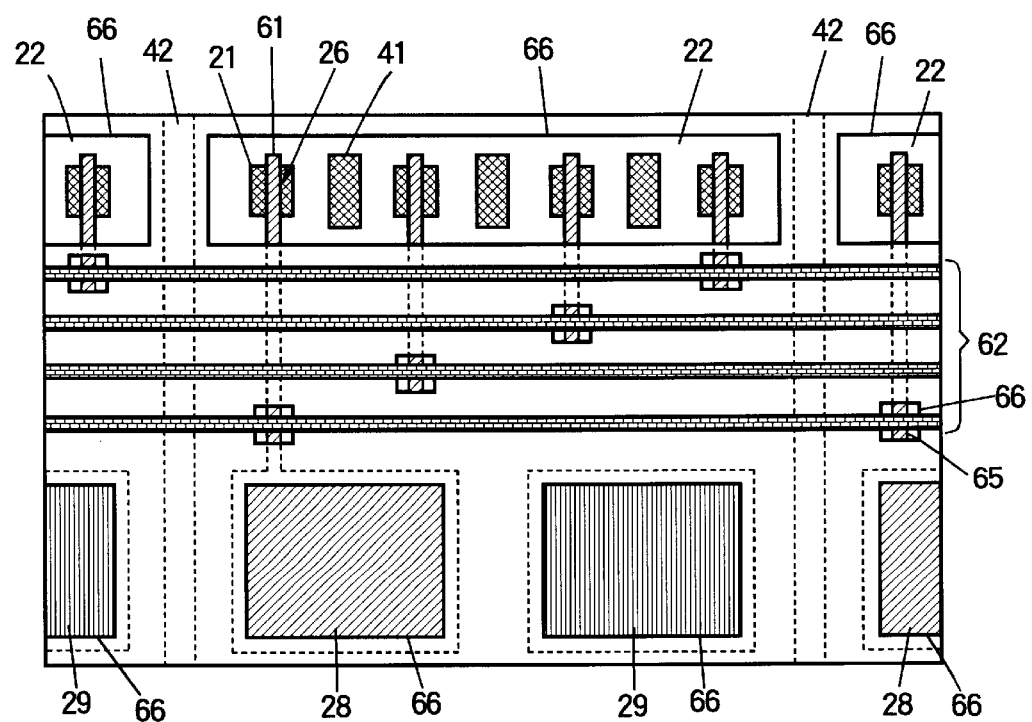

The remaining fabrication steps are carried out as described in the third embodiment. In FIG. 22B, windows 54 for the n-electrodes are created in the diffusion mask 22. In FIG. 22C, the p-electrodes 26, p-electrode bonding pads 28, and p-electrode leads 61 are formed by depositing and patterning a conductive film, such as a multi-layer film including gold. In FIG. 22D, the n-electrode pads 29 are formed by depositing and patterning a conductive film such as a gold alloy film. The steps illustrated in FIGS. 22B, 22C, and 22D can be performed in various alternative sequences. In FIG. 22E, an inter-layer dielectric film 63 of polyimide, for example, is deposited and patterned, and the common interconnecting lines 62 are formed by depositing and patterning a conductive metal film.

Both the non-emitting p-type regions 41 and the p-type isolation regions 42 have the effect of increasing the amount of light emitted from the adjacent light-emitting regions 21, as described in the second embodiment. While this increase does not correct the tendency of the two light-emitting regions 21 at the ends of the array to emit less light than the light-emitting regions 21 in the interior of the array, the fourth embodiment is advantageous in arrays in which the two end light-emitting regions 21 are far enough from the edges of the chip that this tendency does not exist.

Next, a fifth embodiment will be described. The fifth embodiment uses both the trenches of the first embodiment and the non-emitting p-type regions of the second embodiment.

Figure 23:
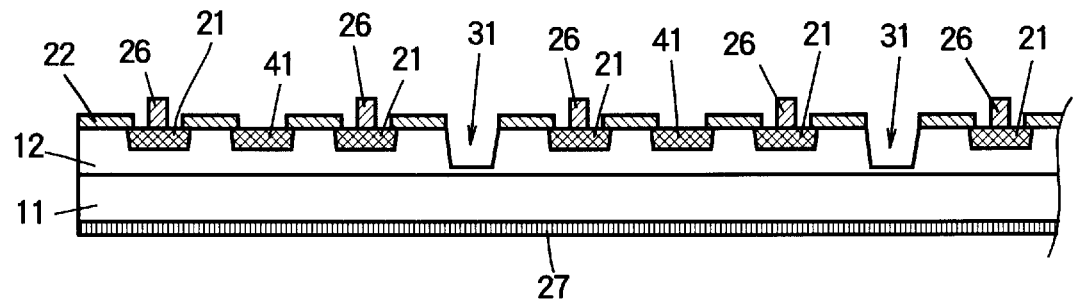
FIG. 23 is a sectional view of an LED array illustrating a fifth embodiment.

Referring to FIG. 23, a non-emitting p-type region 41 is formed between the first and second light-emitting regions 21 in the array, and a light-reduction trench 31 between the second and third light-emitting regions 21. Non-emitting p-type regions 41 and trenches 31 continue to alternate in this way up to the last light-emitting region 21 in the array (not visible), which is disposed between a non-emitting p-type region 41 and the far edge of the chip. The alternating arrangement requires that there by an even number of light-emitting regions 21 on the chip, which is the usual case.

Figure 24:
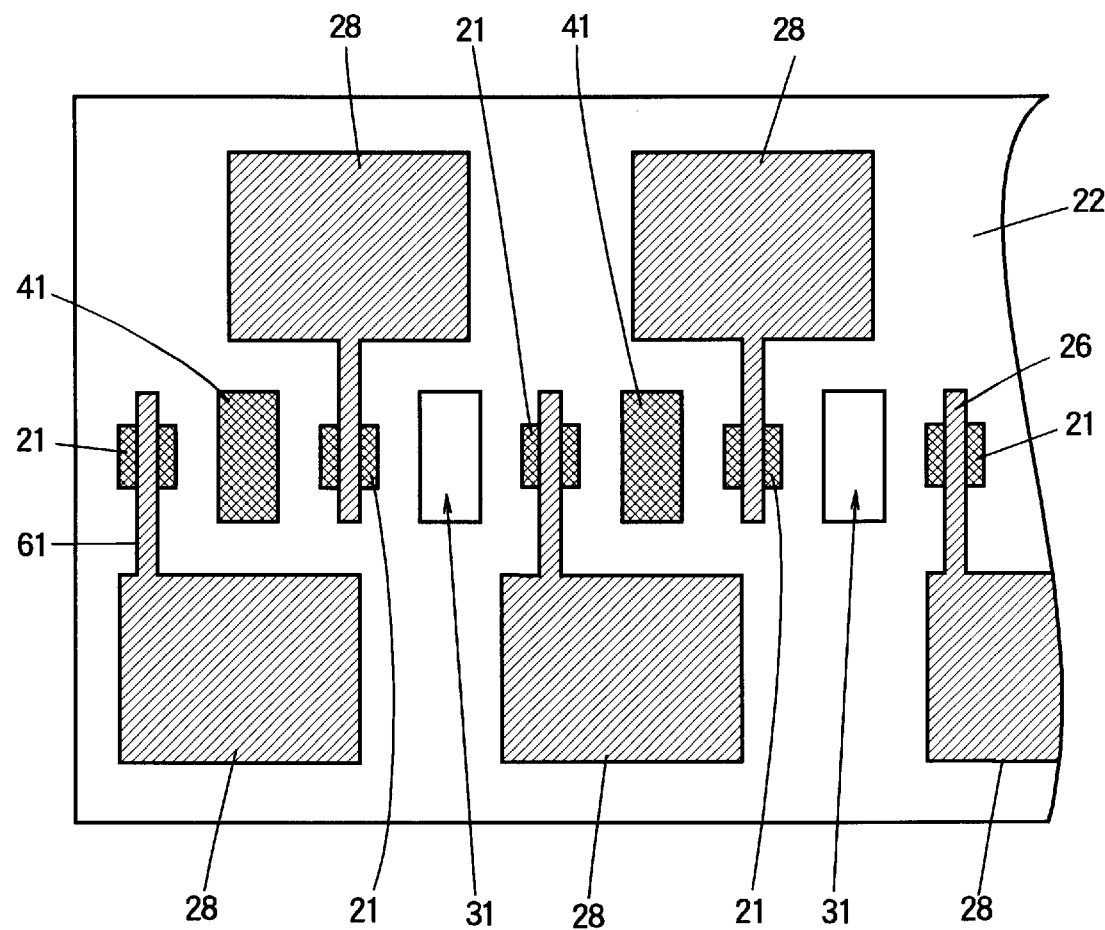
FIG. 24 is a plan view illustrating the fifth embodiment.

Referring to FIG. 24, the light-reduction trenches 31 and non-emitting p-type regions 41 have width and length dimensions similar to those shown in the first and second embodiments, and the p-electrodes 26, p-electrode bonding pads 28, and p-electrode leads 61 also have the structures described in those embodiments. The p-electrode bonding pads 28 may be disposed on alternate sides of the array, as shown, or on the same side, space permitting.

In this arrangement, the light intensity profile of each light-emitting region 21 is enhanced on one side by a non-emitting p-type region 41, and truncated on the other side, either by a trench 31 or by the edge of the chip. The net effect is that the amount of light emitted by each light-emitting region 21 is substantially the same as if the trenches 31, the non-emitting p-type regions 41, and the edges of the chip were not present. The light-emitting regions 21 at the two ends of the array thus emit the same amount of light as the other light-emitting regions 21 in the array, and the output of no light-emitting region 21 is greatly reduced.

Figure 25:
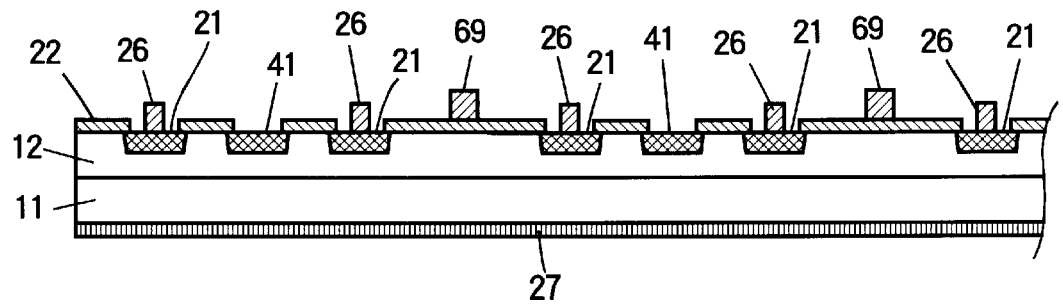
FIG. 25 is a sectional view of an LED array illustrating a variation of the fifth embodiment.

In a variation of the fifth embodiment, the emission-altering elements that truncate the intensity profiles of adjacent light-emitting regions 21 are opaque members 69 as shown in FIG. 25. The opaque members 69 are disposed on the diffusion mask 22, and are formed from the same material as the electrodes 26, in the same fabrication step. The opaque members 69 reflect light back into the semiconductor epitaxial layer 12. The width and length of the opaque members 69 can be selected to obtain the same degree of light truncation as at the two edges of the chip.

Figure 26:
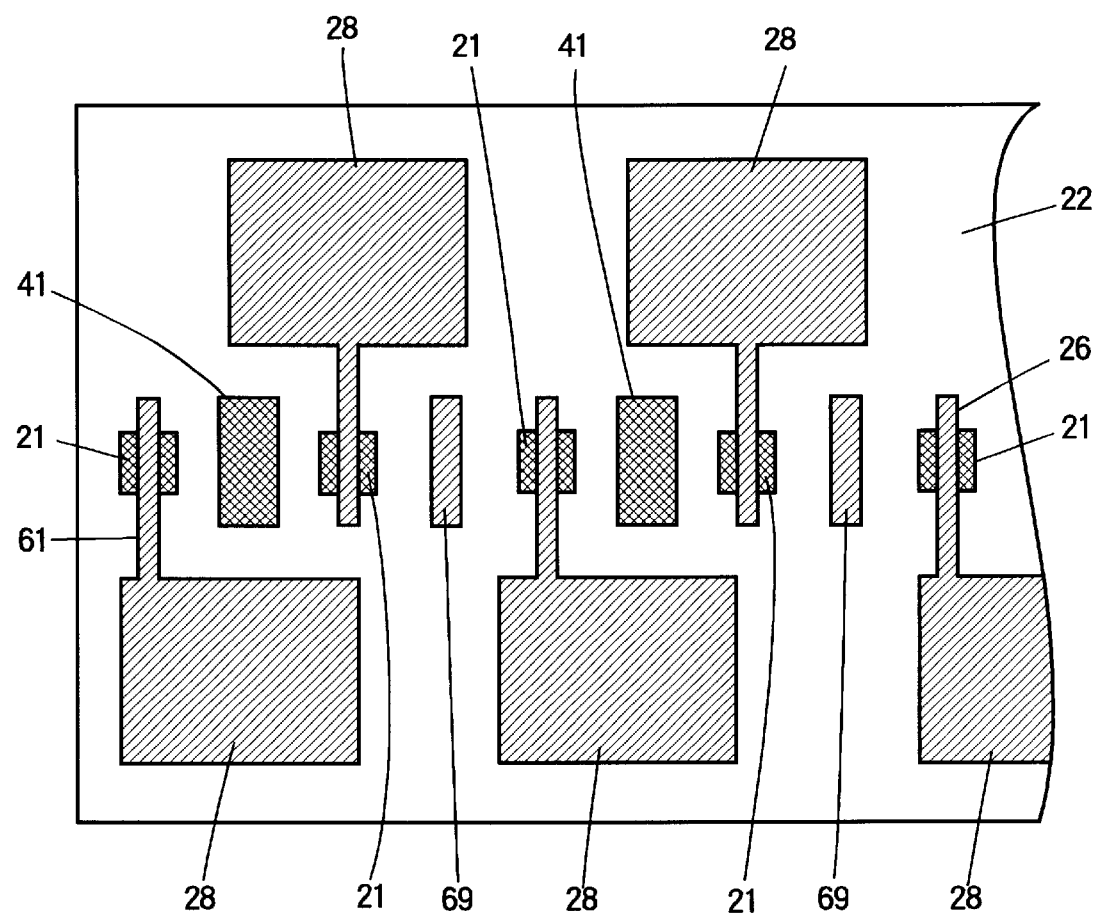
FIG. 26 is a plan view illustrating the variation in FIG. 25.

FIG. 26 shows a plan view of this variation. This variation has the advantage of reduced fabrication cost, since it is not necessary to form trenches. Similar opaque members can be used instead of trenches in the first and third embodiments.

In another variation of the fifth embodiment, the multi-level wiring scheme of the third and fourth embodiments is used, and the semiconductor epitaxial layer 12 is divided into electrically isolated blocks. With four light-emitting regions 21 per block, the isolation trenches 32 of the third embodiment should be used between each pair of blocks. Each block should include two non-emitting p-type regions 41 and one light-reduction trench 31, the light-reduction trench 31 being disposed in the center position in the block.

Figure 27:
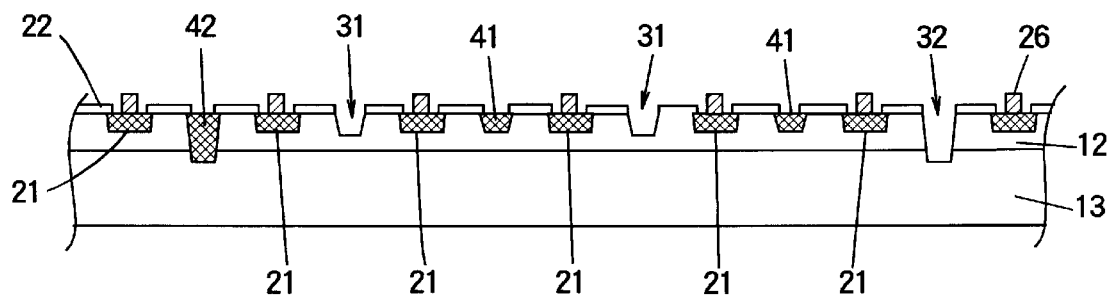
FIG. 27 is a sectional view of an LED array illustrating another variation of the fifth embodiment.
Figure 28:
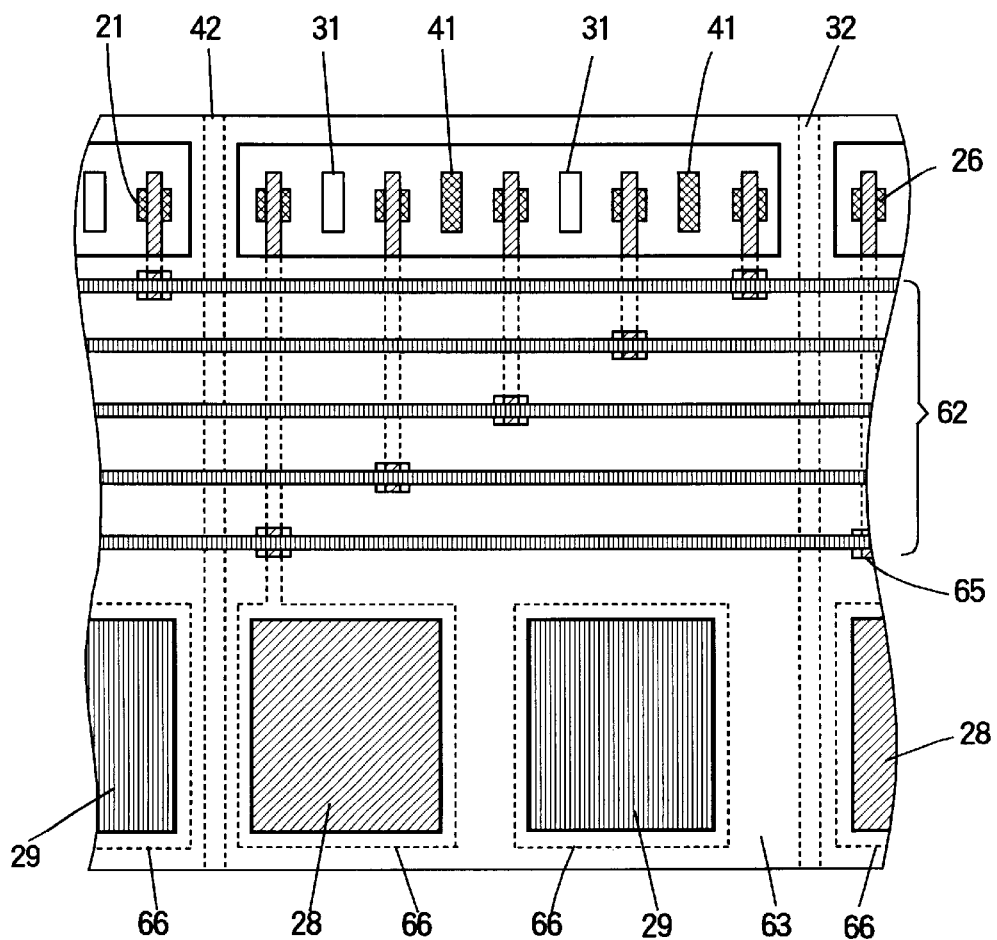
FIG. 28 is a plan view illustrating the variation in FIG. 27.

If the number of light-emitting regions 21 per block differs from four, then various other combinations can be used to maintain an alternation of trenches and non-emitting p-type regions from one end of the chip to the other. If the number of light-emitting regions 21 per block is odd, for example, then isolation trenches 32 and p-type isolation regions 42 should be used between alternate blocks, and both light-reduction trenches 31 and non-emitting p-type regions 41 should be used alternately inside each block. FIG. 27 shows a sectional view exemplifying this arrangement, with five light-emitting regions 21 per block. Each block is separated from its neighboring blocks by a p-type isolation region 42 on one side, and an isolation trench 32 on the other side. FIG. 28 shows a plan view.

Next, a sixth embodiment will be described.

Figure 29:
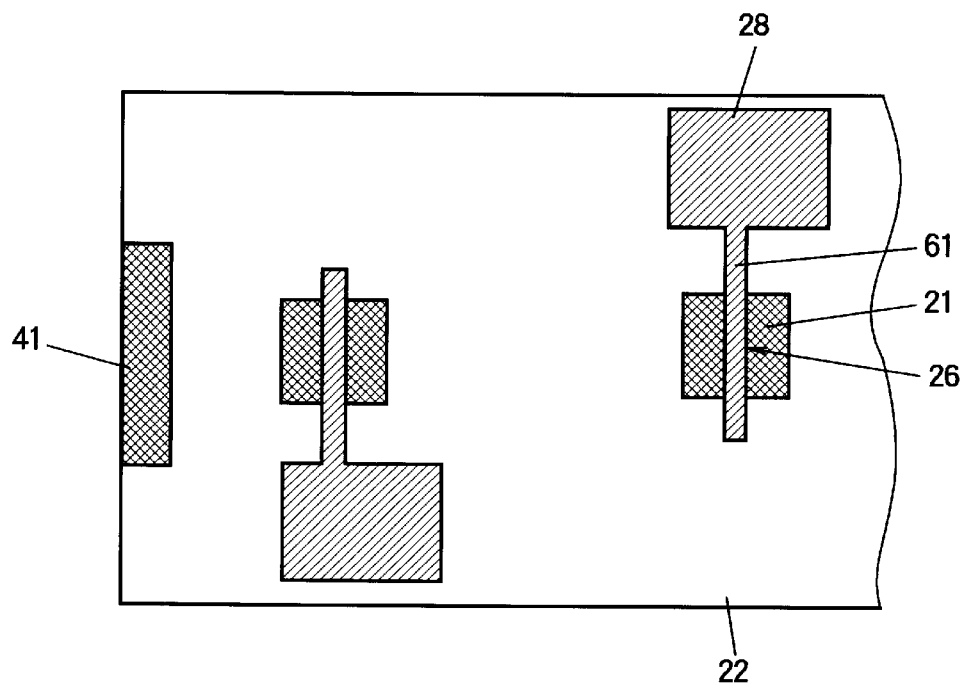
FIG. 29 is a plan view of an LED array illustrating a sixth embodiment.

Referring to FIG. 29, the sixth embodiment places a non-emitting p-type region 41 at each edge of the chip (only one edge is shown), and does not necessarily employ any other emission-altering elements. The light-emitting regions 21, diffusion mask 22, p-electrodes 26, p-electrode bonding pads 28, and p-electrode leads 61 have the structure described in the first embodiment.

Figure 30A:
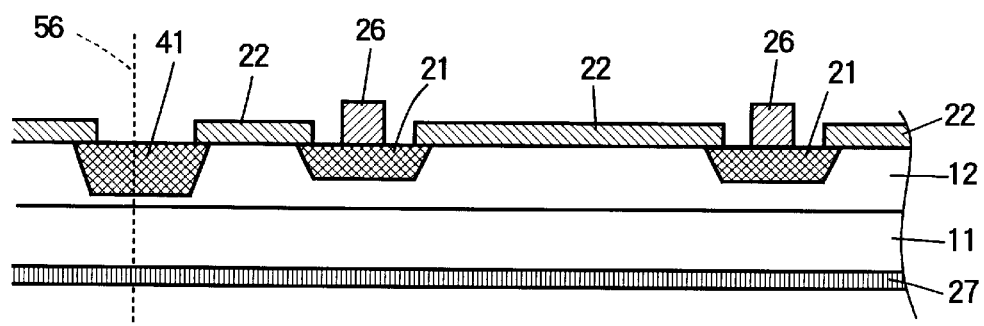
FIG. 30A is a sectional view of the sixth embodiment before wafer dicing.
Figure 30B:
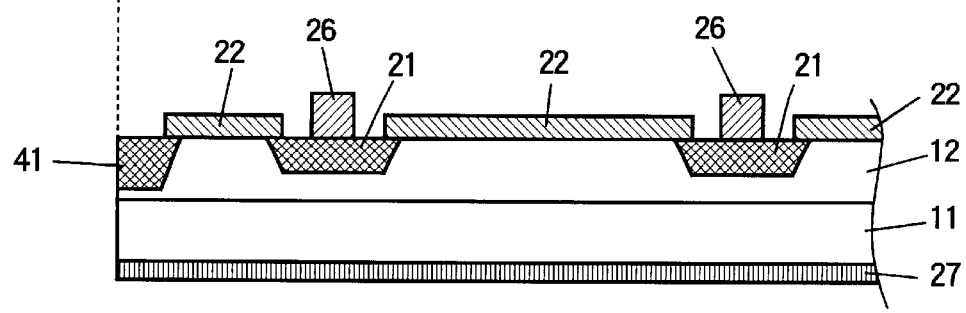
FIG. 30B is a sectional view of the sixth embodiment after wafer dicing.

Referring to FIG. 30A, the sixth embodiment is fabricated as one chip on a wafer, as described in the first embodiment. The non-emitting p-type region 41 is formed on a dicing line 56, where the wafer will be cut into separate chips. The dicing line 56 preferably passes through the center of the non-emitting p-type region 41. After dicing, the non-emitting p-type region 41 extends to the edge of the chip, as shown in FIG. 30B. FIGS. 30A and 30B also show the semiconductor substrate 11, semiconductor epitaxial layer 12, and n-electrode 27, which have the structure described in the first embodiment.

The non-emitting p-type region 41 in the sixth embodiment increases the light output of the light-emitting region 21 at each end of the array, compensating for the truncation caused by the edge of the chip. The light-emitting region 21 at each end of the array thus emits substantially the same amount of light as the other light-emitting regions 21 in the array.

If the non-emitting p-type region 41 does not exactly compensate for the truncation caused by the edge of the chip, then non-emitting p-type regions or light-reduction trenches, or both, can be added in the spaces between the light-emitting regions 21 to provide further compensation, so that all light-emitting regions 21 emit the same amount of light. If the non-emitting p-type regions 41 at the edges of the chip fall short of fully compensating for the edge truncation effect, for example, so that the light-emitting regions at the ends of the array still emit too little light, an alternating pattern of non-emitting p-type regions and trenches with suitable dimensions can be added to the interior of the array. If the non-emitting p-type regions 41 at the edge of the chip overcompensate for the edge truncation effect, so that the light-emitting regions at the ends of the array emit too much light, an alternating pattern of large and small non-emitting p-type regions can be added to the interior of the array. In this way it is possible both to obtain uniform light emission and to increase the amount of emitted light.

The remaining embodiments are LED arrays with multi-layer wiring that use electrodes, electrode leads, or other opaque members to replace some or all of the light-reduction trenches in the third embodiment.

Figure 31:
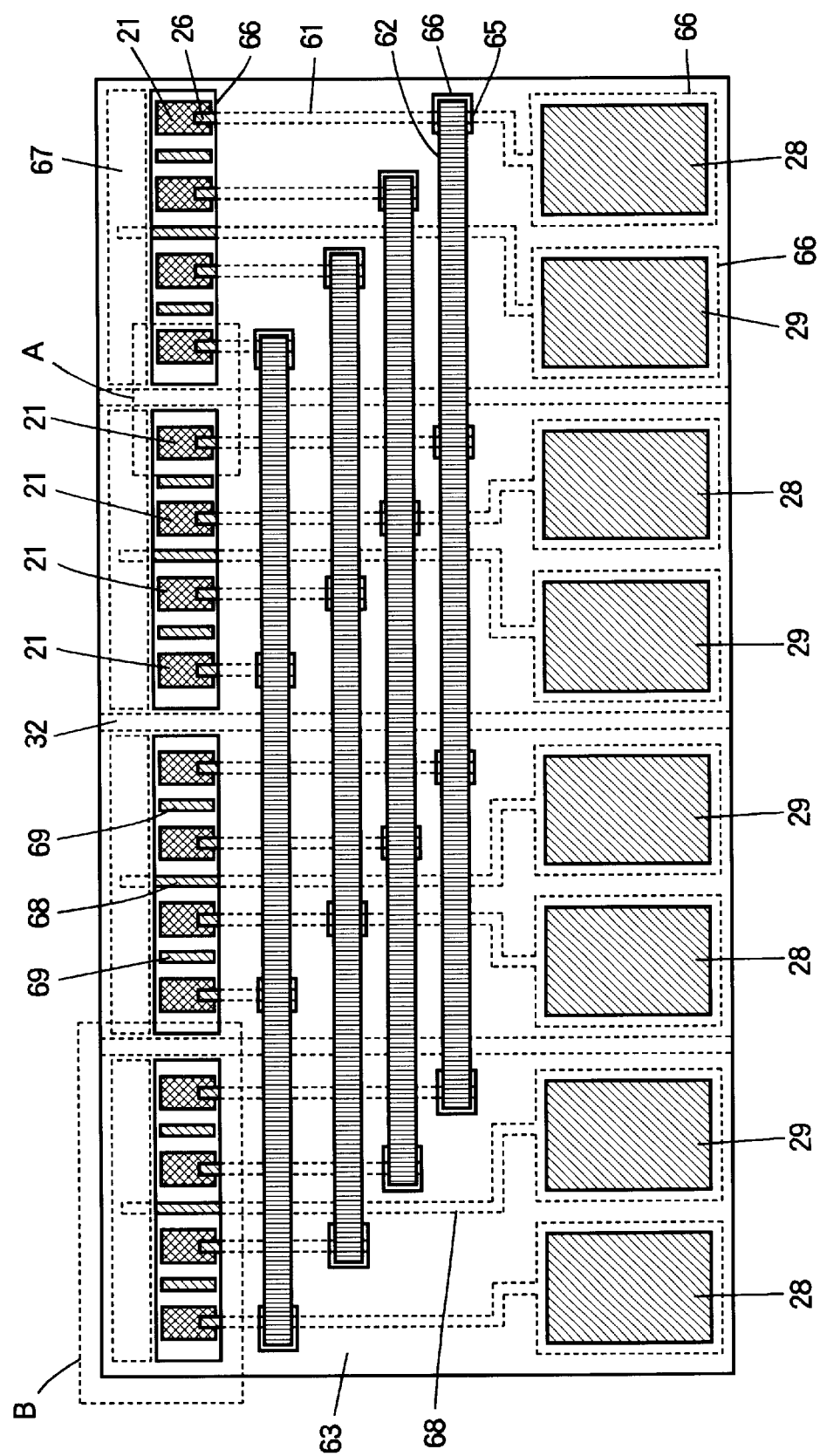
FIG. 31 is a plan view of an LED array illustrating a seventh embodiment.

Referring to FIG. 31, the seventh embodiment is shown for illustrative purposes as an array with sixteen light-emitting regions 21, divided into blocks of four. In practice, the numbers of light-emitting regions 21 and blocks may be higher than shown. Each block has four light-emitting regions 21 with respective p-electrodes 26, one p-electrode bonding pad 28, one n-electrode pad 29, and four p-electrode leads 61. These elements are substantially as described in the third embodiment, except that the n-electrode pad 29 functions only as a bonding pad, and does not make direct contact with the n-type semiconductor material.

In addition, each block has an n-electrode 67, an n-electrode lead 68 joining the n-electrode 67 to the n-electrode bonding pad 29, and two opaque members 69. The n-electrode lead 68 passes between the two middle light-emitting regions 21 in the block. The opaque members 69 are disposed between these middle light-emitting regions 21 and the two outer light-emitting regions 21 in the block. Neither the n-electrode lead 68 nor the opaque members 69 make contact with any light-emitting region 21.

The n-electrode leads 68 and opaque members 69 are disposed in the first wiring layer, together with the p-electrodes 26, p-electrode leads 61, and p-electrode bonding pads 28. The p-electrodes 26, p-electrode leads 61, n-electrode leads 68, and opaque members 69 include an opaque conductive material such as gold. The p-electrode bonding pads 28 and n-electrode bonding pads 29 may also be formed of this material.

As in the third embodiment, the blocks are electrically isolated from one another by isolation trenches 32; the p-electrode leads 61 in different blocks are interconnected by common interconnecting lines 62 in an upper wiring layer, through contacts 65; and an inter-layer dielectric film 63 with windows 66 separates the two wiring layers.

Figure 32:
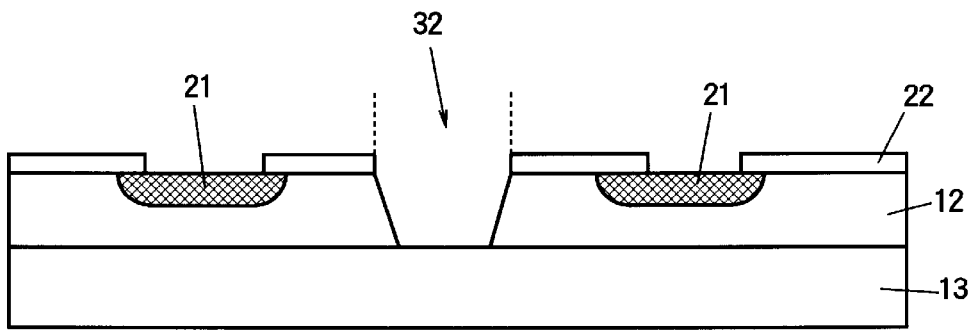
FIG. 32 is a sectional view of area A in FIG. 31.

Referring to FIG. 32, which shows a sectional view of area A in FIG. 31, the LED array includes a high-resistance substrate 13 such as a semi-insulating GaAs substrate, and a semiconductor epitaxial layer 12 such as an n-type AlGaAs layer, which is covered by a diffusion mask 22 having windows for the light-emitting regions 21. The isolation trenches 32 extend through the diffusion mask 22 and semiconductor epitaxial layer 12 down to the high-resistance substrate 13, and may extend partly into the high-resistance substrate 13, as was shown in the third embodiment.

Figure 33B:
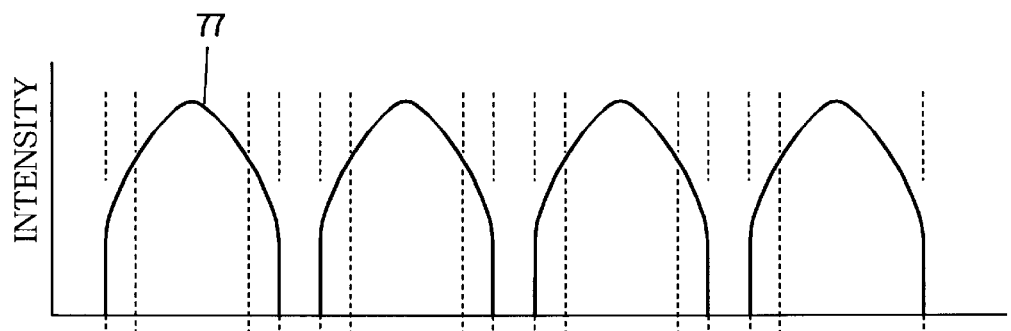
FIG. 33B is a graph showing light intensity profiles in FIG. 33A.
Figure 33A:
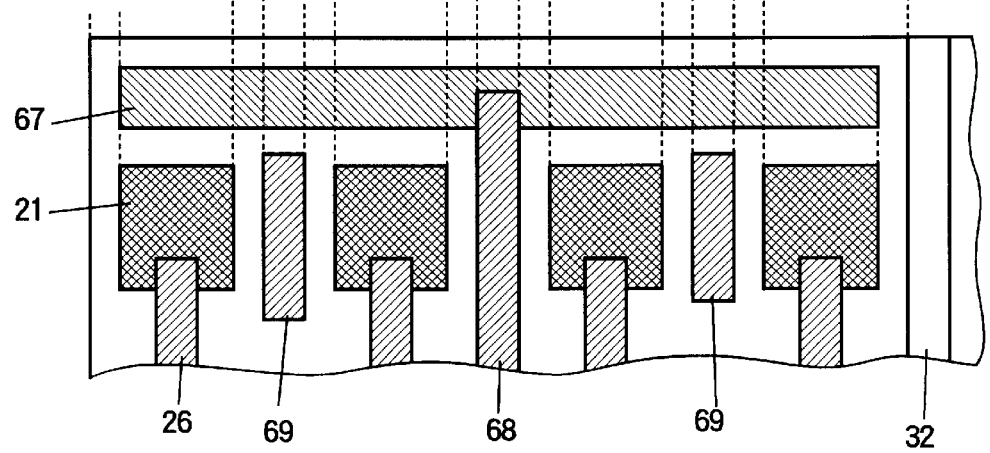
FIG. 33A is an enlarged plan view of area B in FIG. 31.

An enlarged plan view of area B in FIG. 31 is shown in FIG. 33A, with the inter-layer dielectric film 63 omitted for clarity. Corresponding light intensity profiles 77 are shown in FIG. 33B. The intensity profiles 77 of the first and fourth light-emitting regions 21 are truncated by the edge of the chip and the isolation trench 32 separating the first block from the second. All of the intensity profiles 77 are also truncated by the n-electrode lead 68 and opaque members 69, which reflect light back into the chip. Each intensity profile 77 is truncated on both sides; all light-emitting regions 21 thus emit the same amount of light. The same is true of the other blocks in the array.

Next, a fabrication process for the seventh embodiment will be described.

Figure 34A:
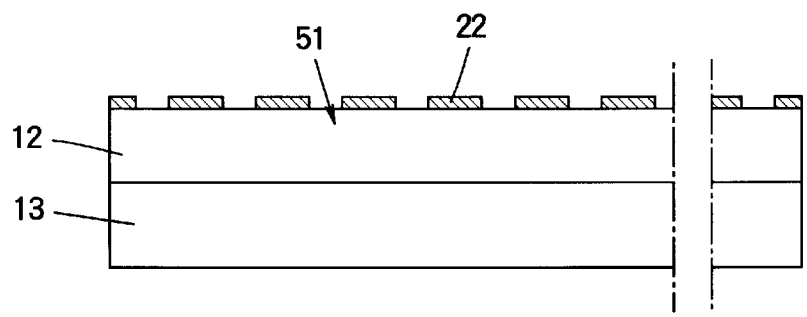
FIGS. 34A to 34F are sectional views illustrating steps in a fabrication process for the seventh embodiment.
Figure 34B:
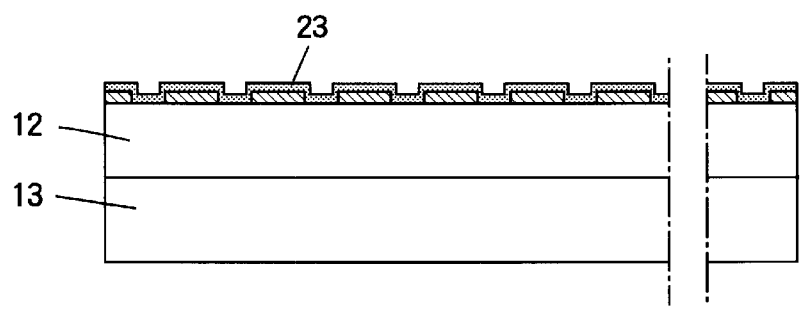
Figure 34C:
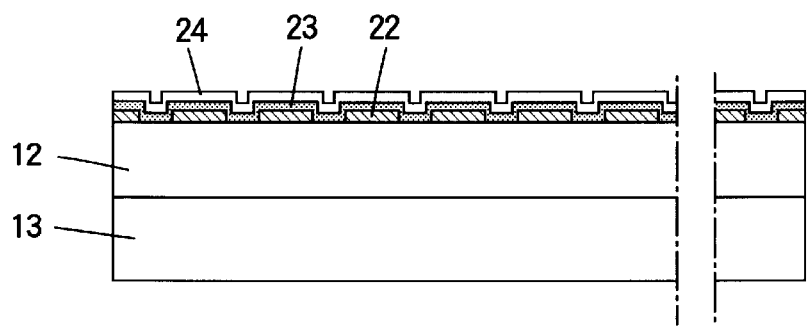
Figure 34D:
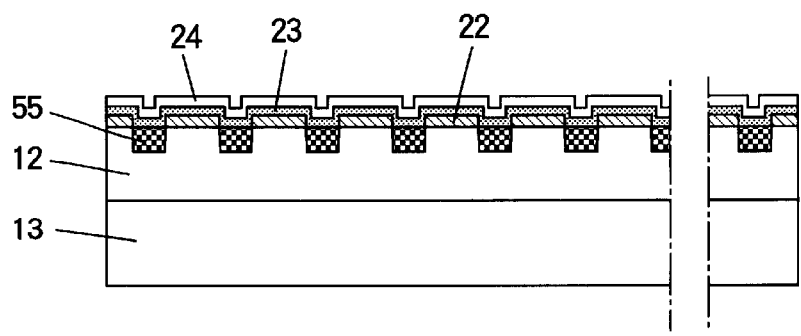
Figure 34E:
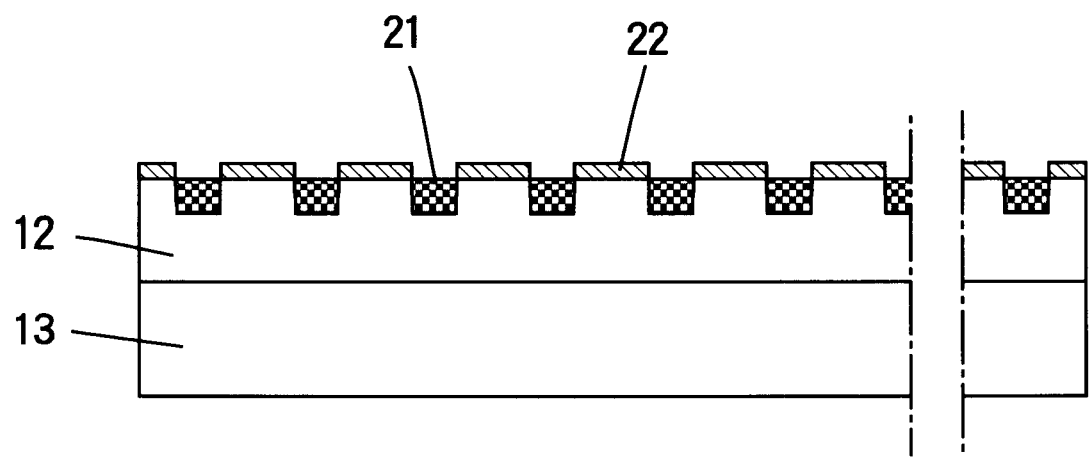
Figure 34F:
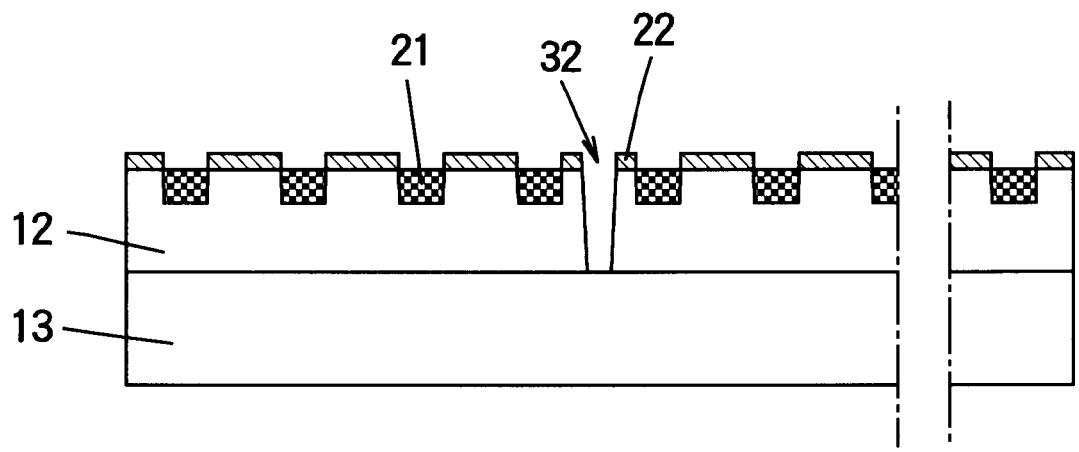

The steps shown in FIGS. 34A to 34F are substantially identical to the corresponding steps in the third embodiment. In FIG. 34A, a diffusion mask 22 of silicon nitride, for example, is formed with windows 51 that will define the light-emitting regions. In FIG. 34B, a diffusion source film 23 comprising $ZnO-SiO_2$, for example, is deposited by sputtering. In FIG. 34C, an anneal cap 24 of aluminum nitride, for example, is deposited by sputtering. In FIG. 34D, the wafer is annealed, forming p-type diffusion regions 55 with a depth of substantially one micrometer (1 $\mu$m), for example, in the semiconductor epitaxial layer 12. In FIG. 34E, the diffusion source film and anneal cap are removed, leaving the diffusion mask 22, and leaving the diffusion regions as light-emitting regions 21. In FIG. 34F, the isolation trenches 32 are formed by photolithography and etching, using a solution of phosphoric acid and hydrogen peroxide, for example, as an etchant.

Figure 35A:
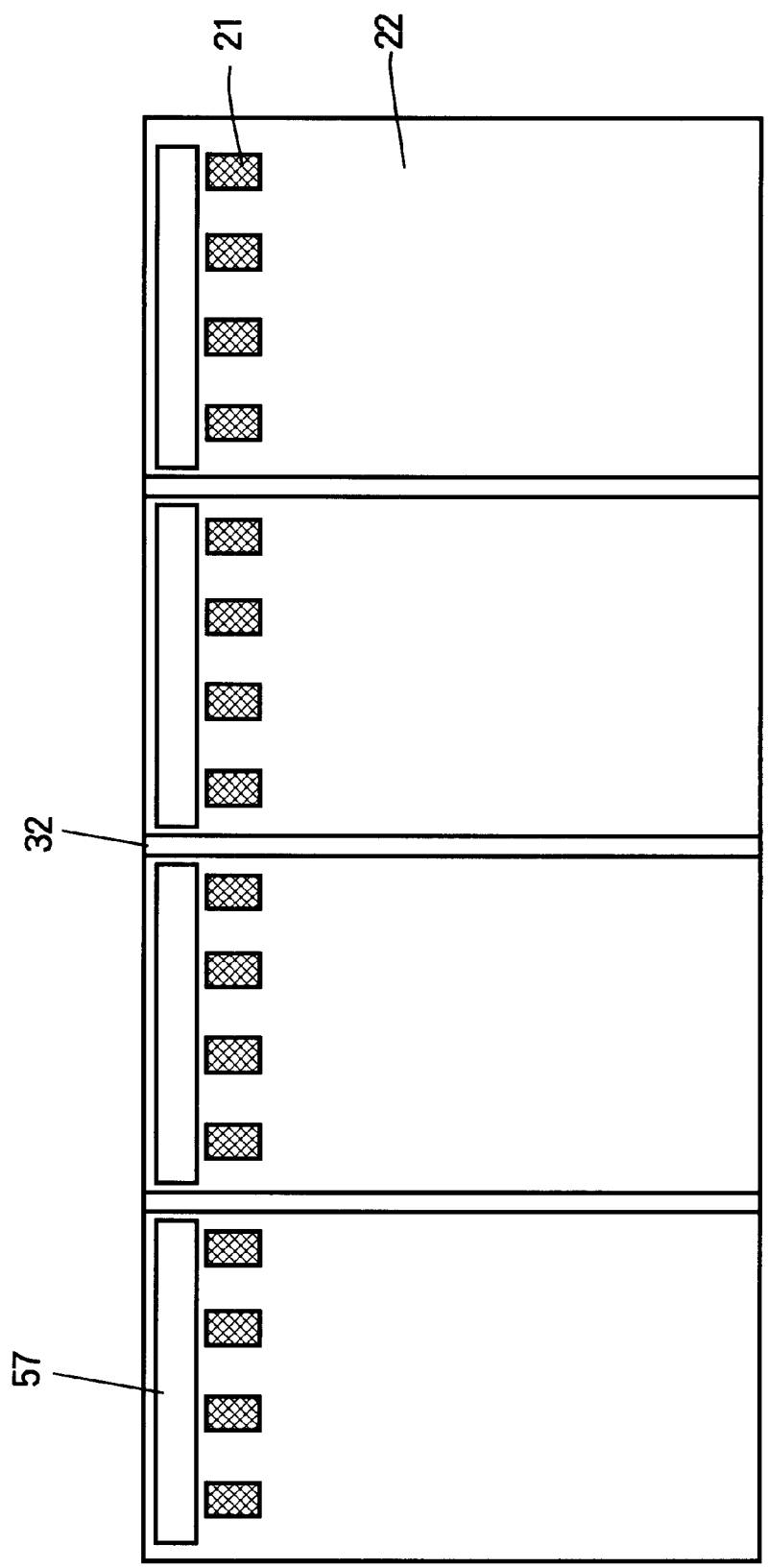
FIGS. 35A to 35E are plan views illustrating further steps in the fabrication process for the seventh embodiment.

Referring to FIG. 35A, windows 57 are now formed in the diffusion mask 22 by photolithography and etching, in the regions in which the n-electrodes will be formed, to permit the n-electrodes to make electrical contact with the n-type semiconductor epitaxial layer.

Figure 35B:
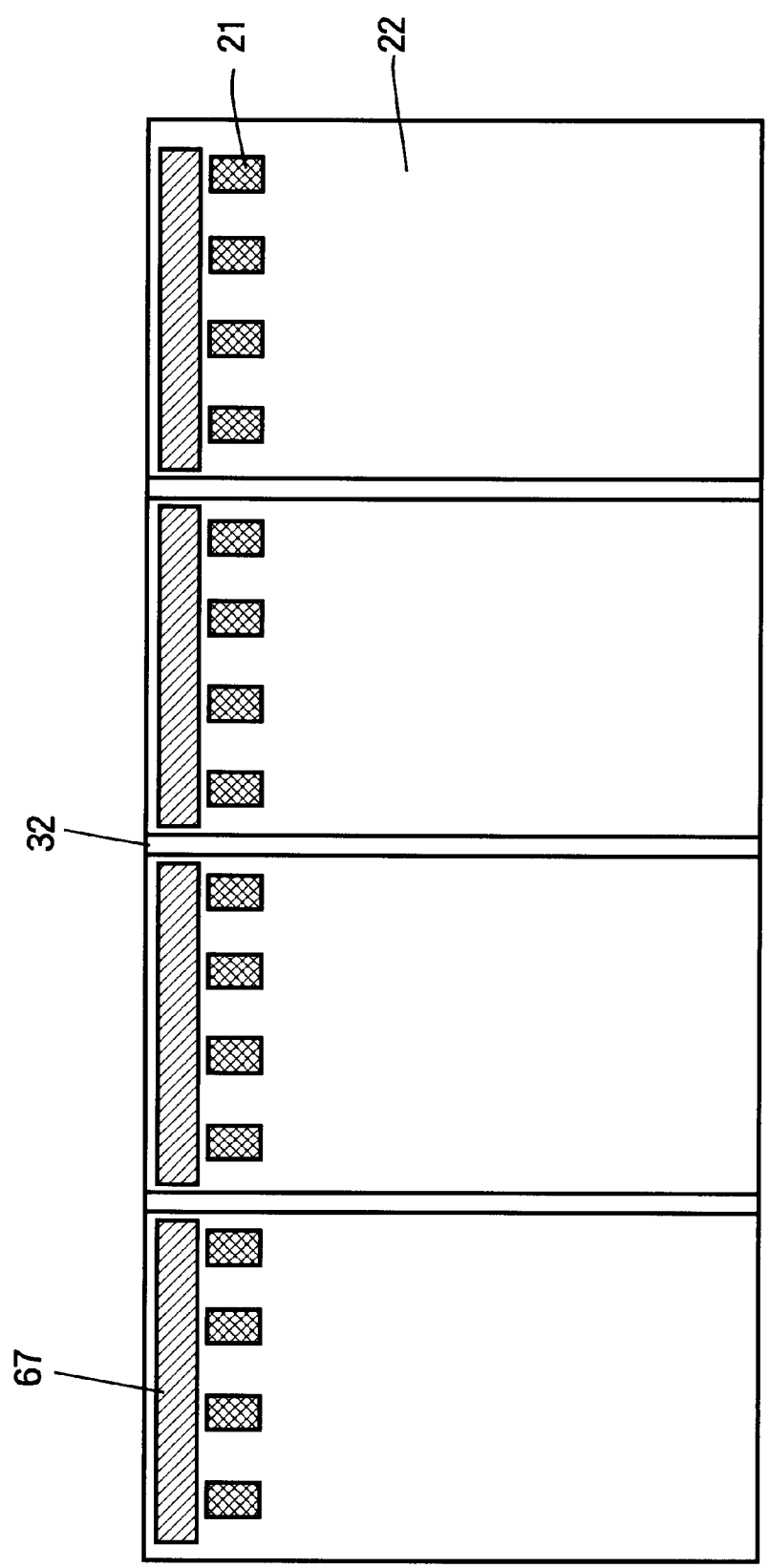

Referring to FIG. 35B, a conductive film such as a gold alloy film is deposited and patterned to form the n-electrodes 67. The lift-off method of patterning can be employed.

Figure 35C:
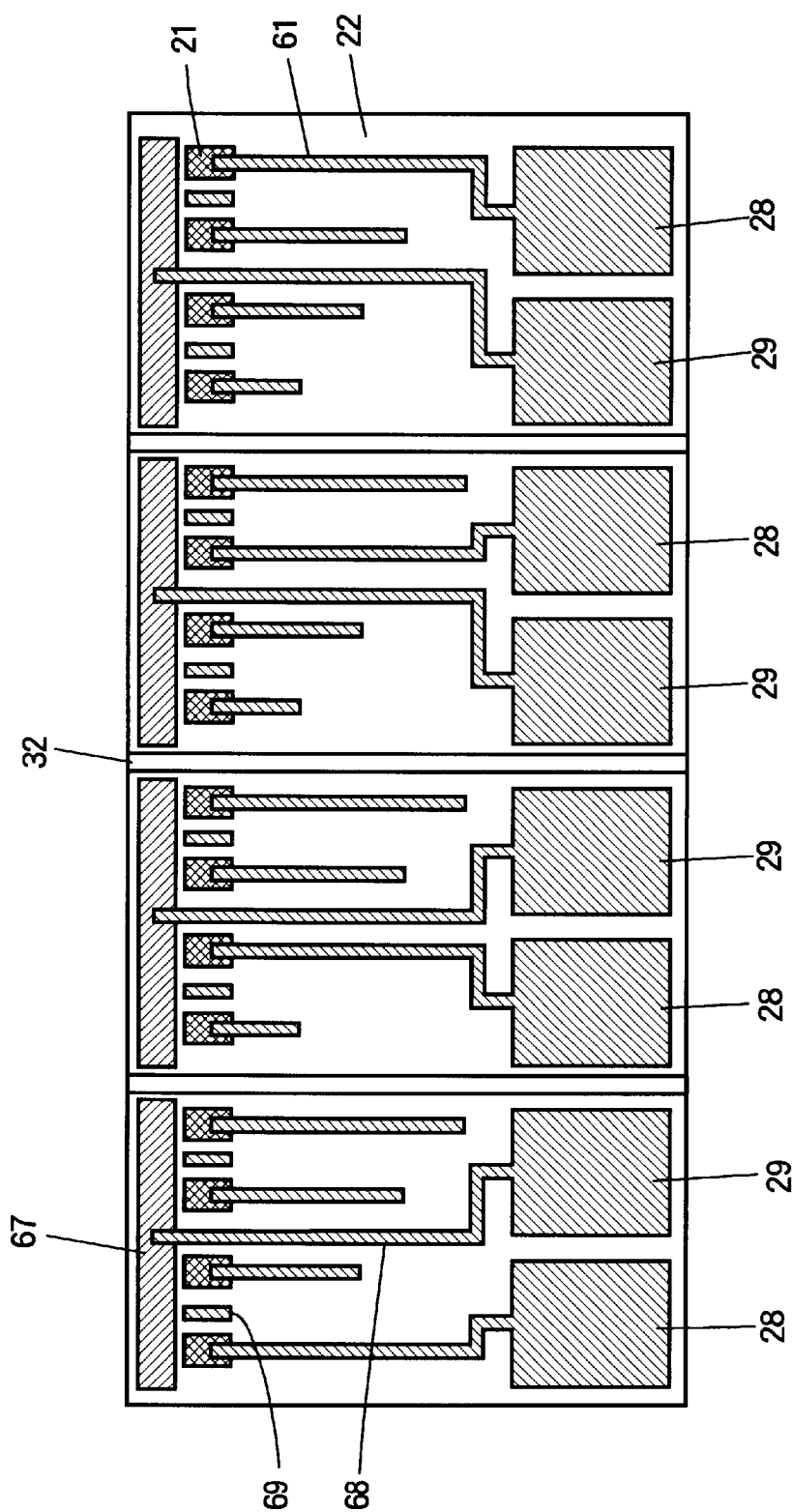

Referring to FIG. 35C, the p-electrodes 26, p-electrode bonding pads 28, n-electrode bonding pads 29, p-electrode leads 61, and n-electrode leads 68 are now formed by depositing and patterning a conductive film such as a multi-layer gold film. The lift-off method of patterning can be used. Differing from the third embodiment, the n-electrode bonding pads 29 are formed on the diffusion mask 22, and do not make direct contact with the semiconductor epitaxial layer 12.

The steps illustrated in FIGS. 35A, 35B, and 35C can be performed in various alternative sequences. For example, the n-electrode leads 68 and n-electrode bonding pads 29 can be formed before the p-electrodes 26, p-electrode bonding pads 28, and p-electrode leads 61 are formed, or the p-electrodes 26, p-electrode bonding pads 28, and p-electrode leads 61 can be formed before the windows 57 are formed. The windows 57 must of course be formed before the n-electrodes 67 and n-electrode leads 68 are formed.

Figure 35D:
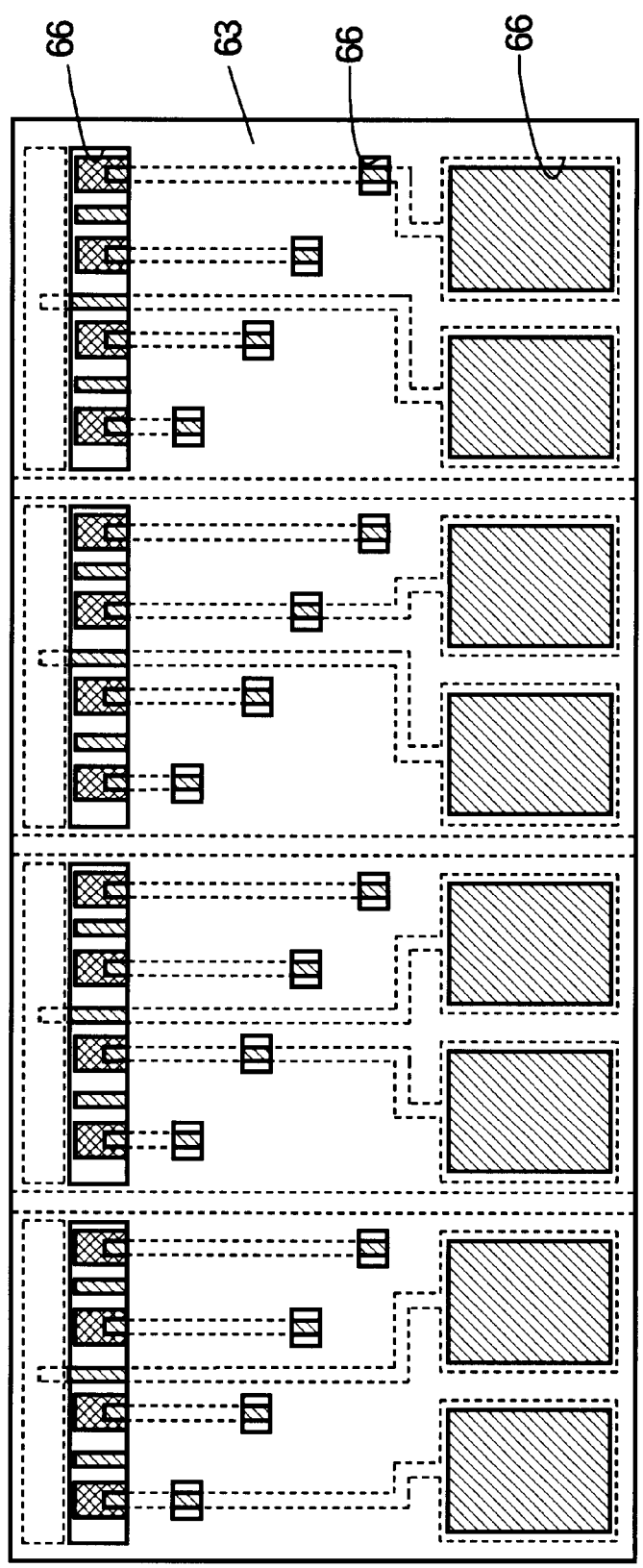

Referring to FIG. 35D, an inter-layer dielectric film 63 of polyimide, for example, is deposited, and patterned to form windows 66 as described above. The patterning can be carried out by photolithography and etching.

Figure 35E:
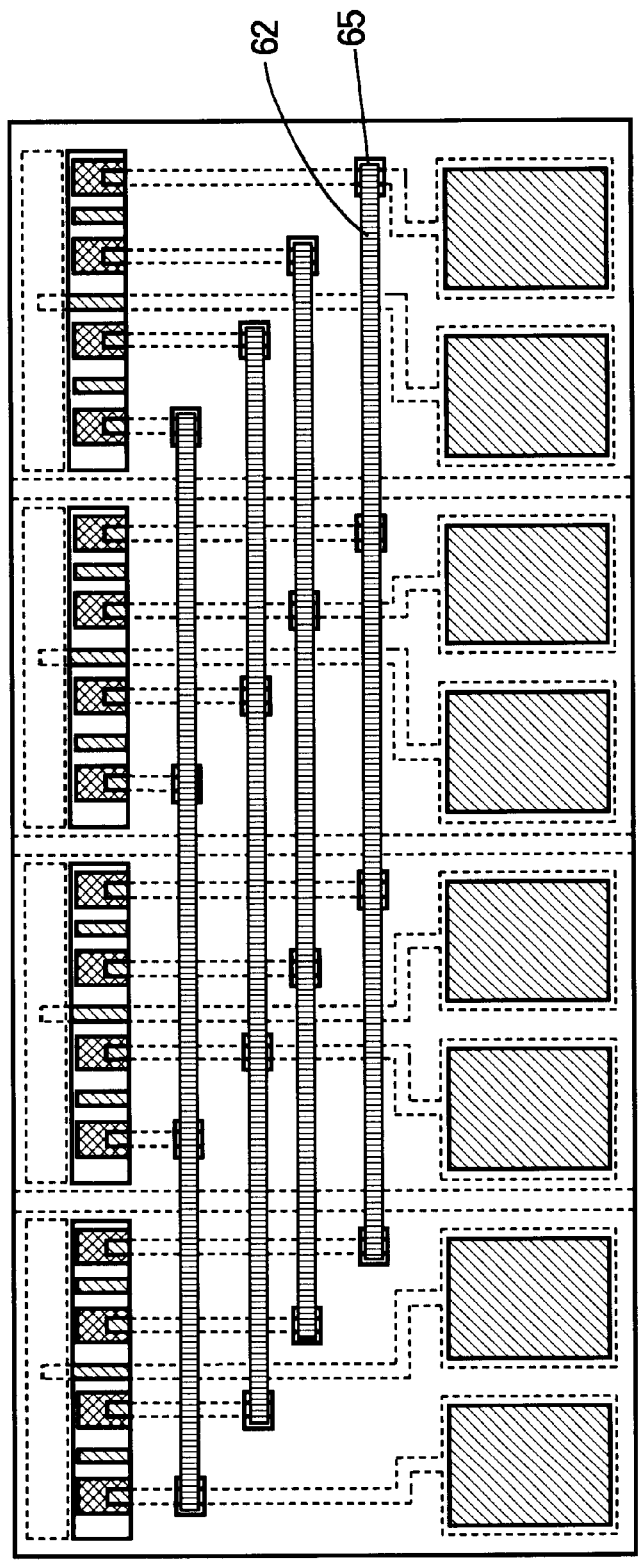

Referring to FIG. 35E, the common interconnecting lines 62, including the contacts 65, are then formed by depositing and patterning a conductive metal film. The lift-off method of patterning can be employed.

The seventh embodiment provides substantially the same effects as the third embodiment. The lengths and widths of the opaque members 69 can be selected to block the desired amount of light, so that the same amount of light is obtained from all light-emitting regions 21. To avoid electrical short circuits, however, the widths of the opaque members 69 and n-electrode leads 68 must be less than the widths of the spaces between the light-emitting regions 21.

In a variation of the seventh embodiment, the opaque members 69 are replaced by p-type non-emitting regions, thereby increasing the amount of light emitted from each light-emitting region, while still obtaining the same amount of light from all light-emitting regions in the array.

Next, an eighth embodiment will be described.

Figure 36:
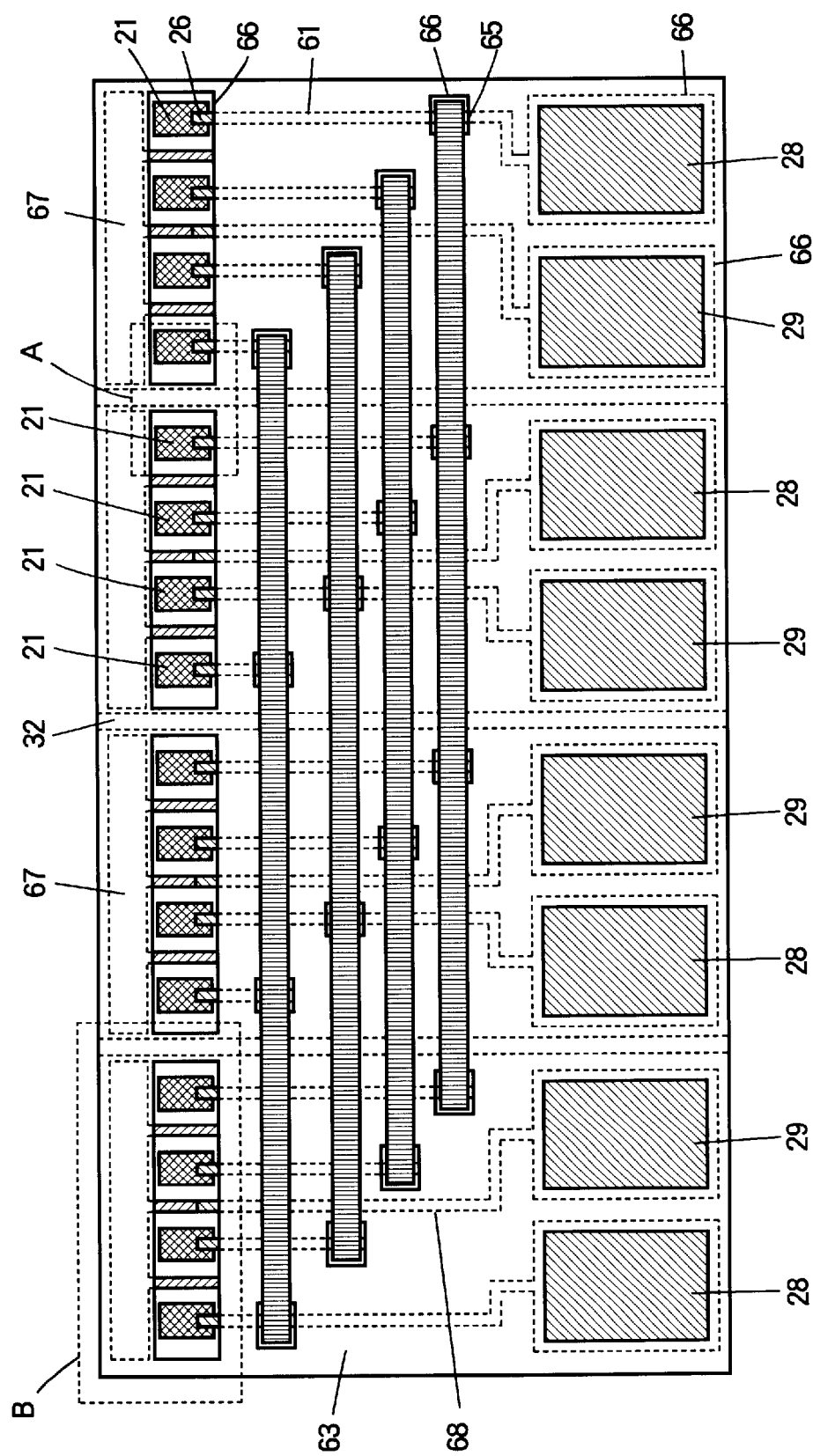
FIG. 36 is a plan view of an LED array illustrating an eighth embodiment.
Figure 37:
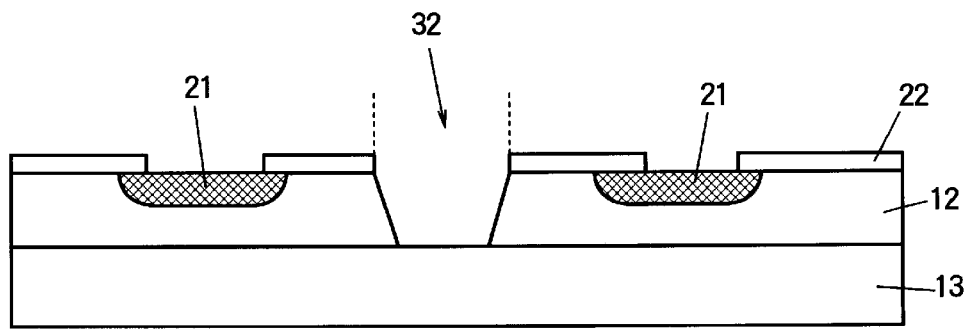
FIG. 37 is a sectional view of area A in FIG. 36.

Referring to FIG. 36, the eighth embodiment replaces the opaque members 69 of the seventh embodiment with extensions of the n-electrodes 67. The n-electrodes 67 are also extended to meet the n-electrode leads 68, which are shorter than in the seventh embodiment. In other respects, the eighth embodiment is identical to the seventh embodiment. Isolation trenches 32 are used to separate the blocks, as shown in FIG. 37, which is a sectional view of area A in FIG. 36.

Figure 38B:
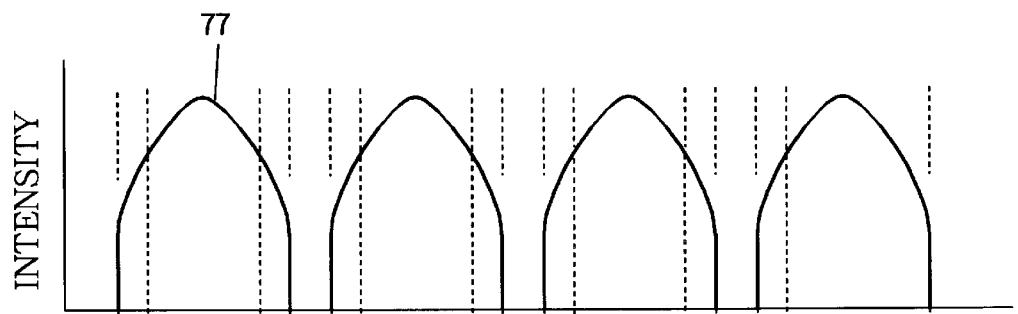
FIG. 38B is a graph showing light intensity profiles in FIG. 38A.
Figure 38A:
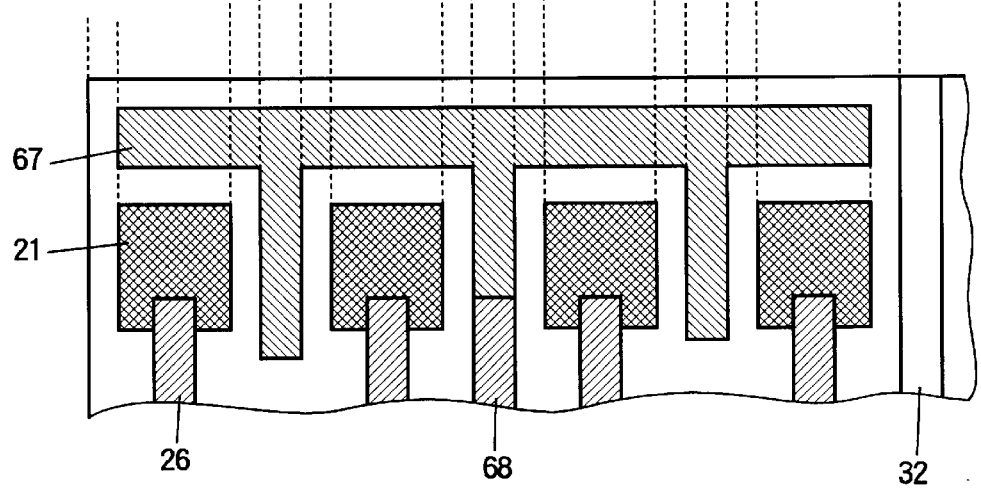
FIG. 38A is an enlarged plan view of area B in FIG. 36.

The shape of the n-electrodes 67 and n-electrode leads 68 can be better seen in FIG. 38A, which is an enlarged view of area B in FIG. 36, showing part of the leftmost block, with the inter-layer dielectric film 63 removed for clarity. The n-electrode 67 has an extension disposed between each mutually adjacent pair of light-emitting regions 21 within the block. The extension of the n-electrode 67 disposed between the middle pair of light-emitting regions 21 meets the n-electrode lead 68. The widths and lengths of these extensions can be selected so as to truncate the light intensity profiles 77 of the light-emitting regions 21, shown in FIG. 38B, by amounts such that all light-emitting regions 21 emit the same amount of light. To prevent short circuits, the n-electrode leads 68 and the extensions of the n-electrodes 67 must be narrow enough to avoid contact with the light-emitting regions 21.

The eighth embodiment can be fabricated by the same process as the seventh embodiment, simply be changing the shape of the windows 57 formed in the diffusion mask 22, the shape of the n-electrodes 67, and the pattern of the first wiring layer.

The eighth embodiment provides the same effects as the seventh embodiment, with the additional effect of decreased electrical resistance on the return path from the light-emitting regions 21 through the semiconductor epitaxial layer 12 to the n-electrodes 67, because the n-electrodes 67 surround each light-emitting region 21 on at least two sides.

Next, a ninth embodiment will be described.

Figure 39:
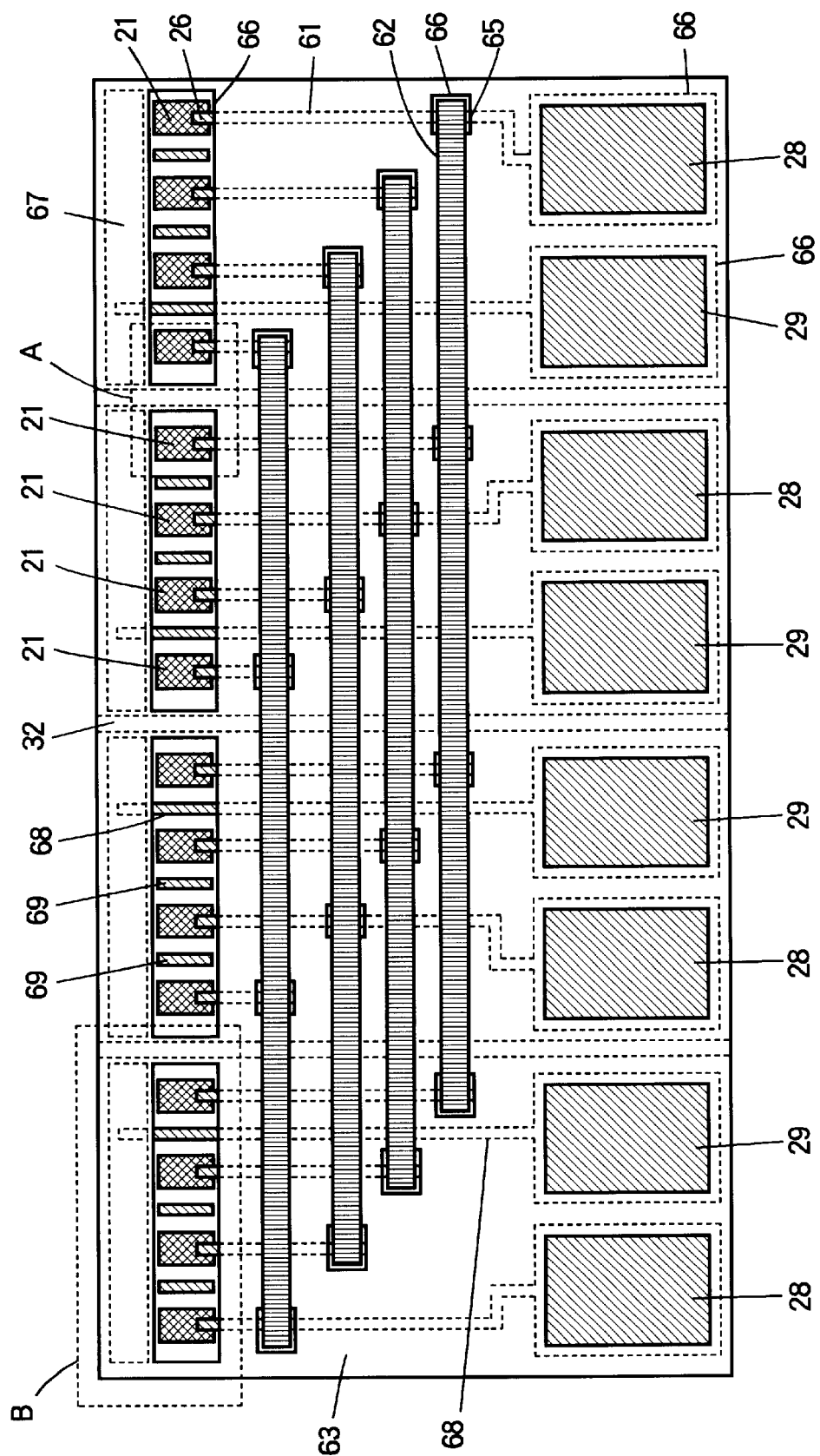
FIG. 39 is a plan view of an LED array illustrating a ninth embodiment.
Figure 40:
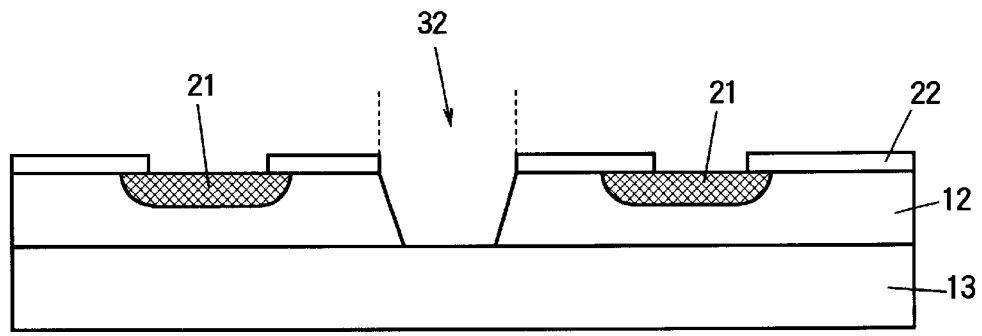
FIG. 40 is a sectional view of area A in FIG. 39.

Referring to FIGS. 39 and 40, the ninth embodiment has the same structure as the seventh embodiment, except for the following differences: the positions of the n-electrode leads 68 are shifted away from the center of each block; and light-reduction trenches 31 are inserted in the vacated central positions.

Figure 41B:
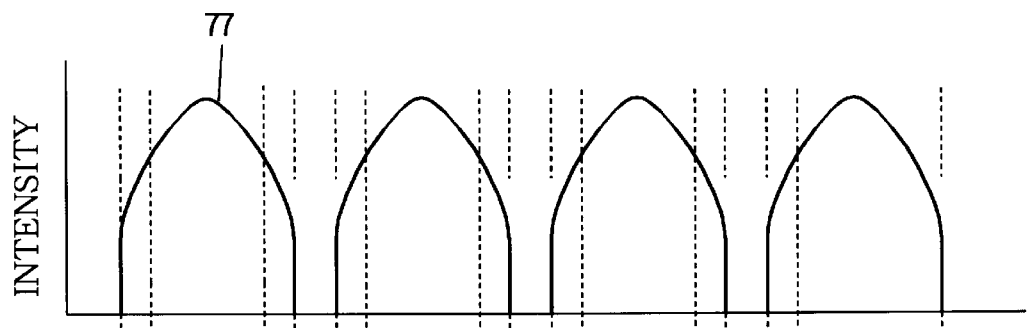
FIG. 41B is a graph showing light intensity profiles in FIG. 41A.
Figure 41A:
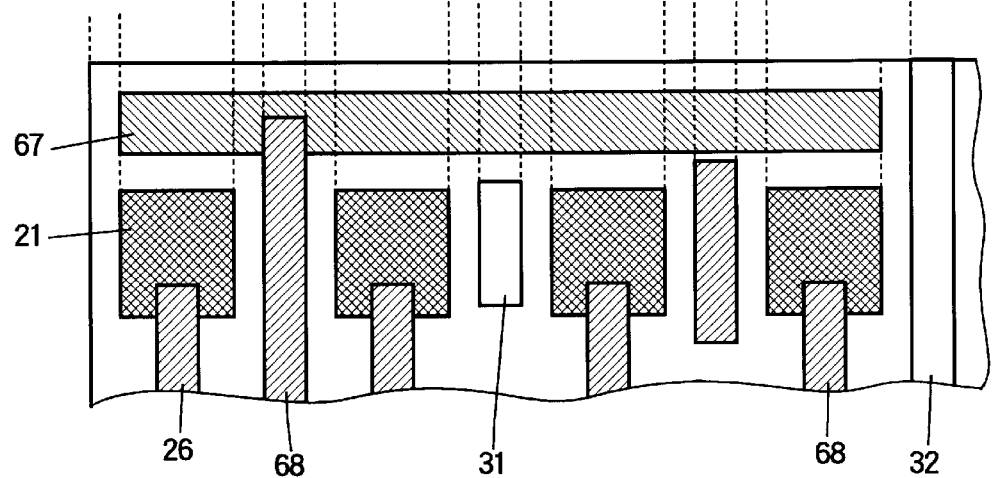
FIG. 41A is an enlarged plan view of area B in FIG. 39.

These differences can be seen more clearly in the enlarged plan view in FIG. 41A, in which the inter-layer dielectric film 63 is removed. A light-reduction trench 31 is disposed between the two middle light-emitting regions 21 in each block. The n-electrode lead 68 is disposed between two light-emitting regions 21 to one side of the center. An opaque member 69 is disposed between the two light-emitting regions 21 on the other side of the center. Thus a light-reduction trench 31 or isolation trench 32 is disposed between every second mutually adjacent pair of light-emitting regions 21, and an n-electrode lead 68 or opaque member 69 is disposed between the other mutually adjacent pairs of light-emitting regions 21.

The lengths of the opaque members 69 and light-reduction trenches 31 can be selected to obtain the desired degree of truncation of the light intensity profiles 77, shown in FIG. 41B. The light-reduction trenches 31, n-electrode leads 68, and opaque members 69 must all be sufficiently narrow to avoid contact with any light-emitting region 21.

The ninth embodiment can be fabricated by substantially the same process as the seventh embodiment, the light-reduction trenches 31 being formed in the same step as the isolation trenches 32.

The ninth embodiment provides substantially the same effects as the seventh embodiment, but each light-emitting region 21 is adjacent on one side to an n-electrode lead 68 or opaque member 69, and on the other side to a light-reduction trench 31 or isolation trench 32, or to the edge of the chip. Every light-emitting region 21 therefore has substantially the same surrounding features, which simplifies the design of these features (the design of the lengths and widths of the light-reduction trenches 31 and opaque members 69, and the widths of the n-electrode leads 68 and isolation trenches 32) to obtain the same amount of light from all light-emitting regions 21.

The ninth embodiment can be modified by increasing the number of light-emitting regions 21 per block, provided a light-reduction trench 31 or isolation trench 32 is still disposed between every second pair of light-emitting regions 21, with n-electrode leads 68 and opaque members 69 between the other pairs of light-emitting regions 21.

Next, a tenth embodiment will be described.

Figure 42:
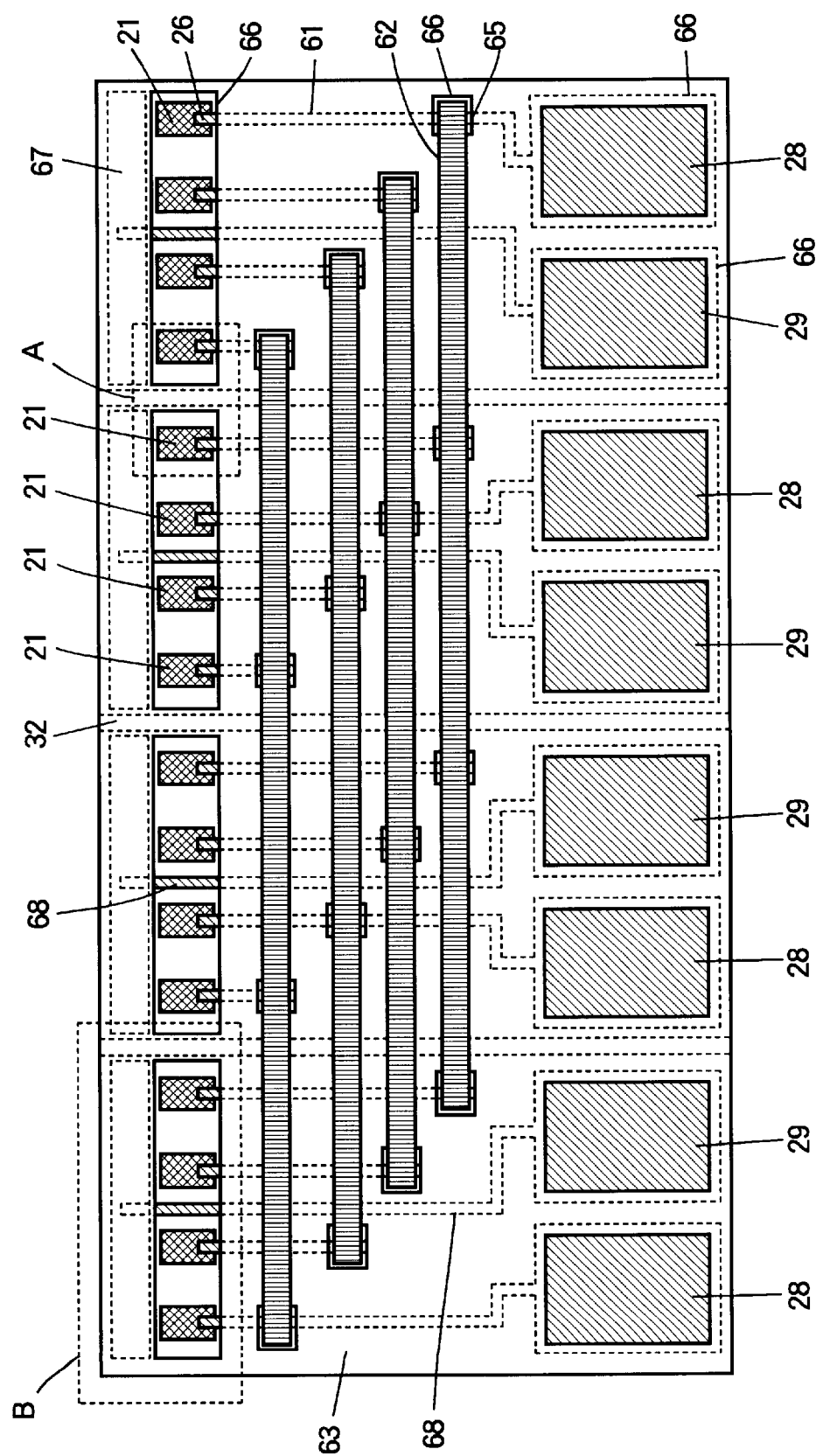
FIG. 42 is a plan view of an LED array illustrating a tenth embodiment.
Figure 43:
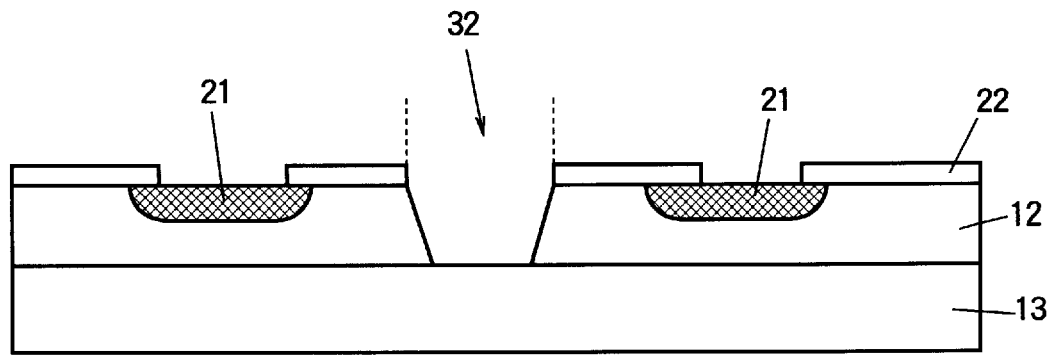
FIG. 43 is a sectional view of area A in FIG. 42.

Referring to FIGS. 42 and 43, the tenth embodiment has the same structure as the seventh embodiment, except that it lacks the opaque members 69.

Figure 44B:
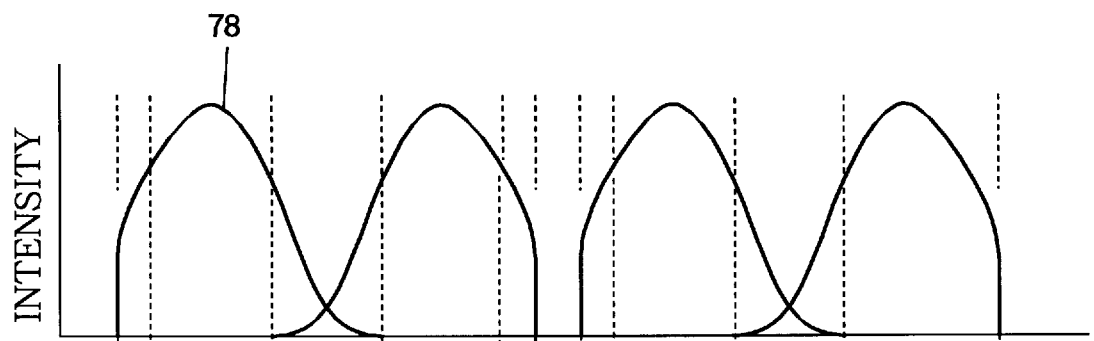
FIG. 44B is a graph showing light intensity profiles in FIG. 44A.
Figure 44A:
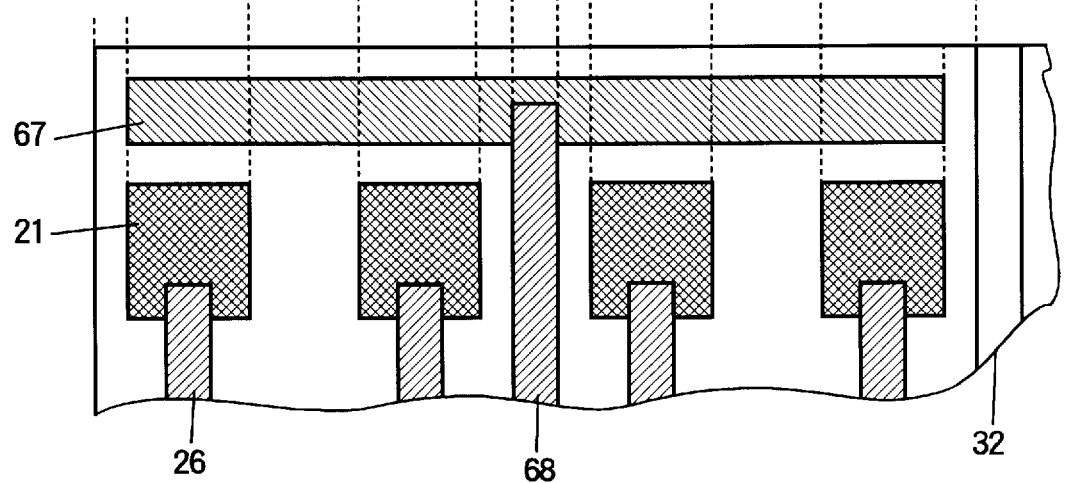
FIG. 44A is an enlarged plan view of area B in FIG. 42.

As shown in FIG. 44A, each light-emitting region 21 is adjacent on one side to an isolation trench 32, an n-electrode lead 68, or the edge of the chip. No emission-altering element is present on the other side of the light-emitting region 21. Accordingly, the light intensity profile 78 of each light-emitting region 21 is truncated on just one side, as shown in FIG. 44B. All light-emitting regions 21 thus emit substantially the same amount of light.

The tenth embodiment can be fabricated by the same process as the seventh embodiment, simply by omitting the opaque members 69 from the pattern formed in the first wiring layer.

The tenth embodiment provides substantially the same effect as the seventh embodiment, but more light is obtained from each light-emitting region 21, since the light intensity profiles 78 are truncated on only one side.

The invention has been described as compensating for reduced emission by the light-emitting elements at the ends of the array, but the invented techniques can also be used to compensate for emission differences that might arise from other causes in various types of arrays.

Applications of the invention are not limited to arrays of light-emitting elements used in electrophotographic printers.

Variations of some of the above embodiments have already been mentioned, but those skilled in the art will recognize that further variations are possible within the scope of claimed below.

What is claimed is:

1. An array of light-emitting elements, having a light-emitting surface side and a semiconductor layer of a first conductive type, with a plurality of light-emitting regions of a second conductive type disposed in the semiconductor layer, the light-emitting regions emitting light through the light-emitting surface side, the semiconductor layer having an edge positioned so as to reduce a useful intensity of light emitted by a first one of said light-emitting regions that, among said light-emitting regions, is closest to said edge, comprising:

at least one emission-altering element extending from the light-emitting surface side into the semiconductor layer, separated from all of the light-emitting regions, separated from a second one of the light-emitting regions by a distance substantially equal to a distance from said edge of the semiconductor layer to said first one of the light-emitting regions altering an amount of light emitted from said second one of the light-emitting regions with no other intervening emission altering elements.

2. The array of claim 1, wherein at least one said emission-altering element is a region of the semiconductor layer having a trench, disposed between a mutually adjacent pair of said light-emitting regions, the trench extending at least partway into the semiconductor layer.

3. An array of light-emitting elements, having a semiconductor layer of a first conductive type, with a plurality of light-emitting regions of a second conductive type disposed in the semiconductor layer, comprising:

at least one emission-altering element separated from all of the light-emitting regions, disposed adjacent at least one of the light-emitting regions, altering an amount of light emitted from said at least one of the light-emitting regions, wherein at least one said emission-altering element is a non-emitting region of said second conductive type, disposed between a mutually adjacent pair of said light-emitting regions, extending at least partway into the semiconductor layer.

4. An array of light-emitting elements, having a semiconductor layer of a first conductive type, with a plurality of light-emitting regions of a second conductive type disposed in the semiconductor layer, comprising:

at least one emission-altering element separated from all of the light-emitting regions, disposed adjacent at least one of the light-emitting regions, altering an amount of light emitted from said at least one of the light-emitting regions, wherein said array is formed in a chip having an edge, and at least one said emission-altering element is a non-emitting region of the second conductive type disposed at said edge, extending at least partway into the semiconductor layer.

5. The array of claim 1, wherein said at least one emission-altering element is an opaque member disposed between a mutually adjacent pair of said light-emitting regions.

6. The array of claim 5, wherein said opaque member also functions as part of an electrode.

7. The array of claim 5, wherein said opaque member also functions as an electrode lead.

8. The array of claim 5, wherein said array also has electrodes, and said opaque member and said electrodes are made of identical materials.

9. The array of claim 1, wherein said plurality of light-emitting regions form a linear array, and an emission-altering element is disposed between every second mutually adjacent pair of said light-emitting regions.

10. The array of claim 9, wherein said emission-altering element decreases the amount of light emitted from said mutually adjacent pair of light-emitting regions, thereby making said amount of light substantially equal to an amount of light emitted by another one of said light-emitting regions disposed at an end of said array.

11. The array of claim 10, wherein each said emission-altering element is a region of the semiconductor layer having a trench, the trench extending at least partway into the semiconductor layer.

12. The array of claim 10, wherein said array has multi-layer wiring, and the emission-altering element disposed between at least one said mutually adjacent pair of light-emitting regions is a region of the semiconductor layer having a trench extending completely through the semiconductor layer, dividing the semiconductor layer into mutually isolated blocks.

13. The array of claim 12, wherein the emission-altering element disposed between at least one other said mutually adjacent pair of light-emitting regions, within one of said blocks, is another region of the semiconductor layer having a trench extending only partway through the semiconductor layer.

14. An array of light-emitting elements, having a light-emitting surface side and a semiconductor layer of a first conductive type, with a plurality of light-emitting regions of a second conductive type disposed in the semiconductor layer, the light-emitting regions emitting light through the light-emitting surface side, comprising:

at least one emission-altering element extending from the light-emitting surface side into the semiconductor layer, separated from all of the light-emitting regions, disposed adjacent one of the light-emitting regions, altering an amount of light emitted from said light-emitting regions, wherein said light-emitting regions form a linear array, and an emission-altering element is disposed between every second mutually adjacent pair of said light-emitting regions, wherein said array has multi-layer wiring, and the emission-altering element disposed between at least one said mutually adjacent pair of light-emitting regions is a region of the semiconductor layer having a trench extending completely through the semiconductor layer, dividing the semiconductor layer into mutually isolated blocks, and wherein said emission-altering element decreases the amount of light emitted from said mutually adjacent pair of light-emitting regions, thereby making said amount of light substantially equal to an amount of light emitted by another one of said light-emitting regions disposed at an end of said array, and the emission-altering element disposed between at least one other said mutually adjacent pair of light-emitting regions, within one of said blocks, is an electrode lead.

15. The array of claim 1, wherein said light-emitting regions form a linear array having two ends, and one said emission-altering element is disposed between every mutually adjacent pair of said light-emitting regions.

16. The array of claim 1, wherein each light-emitting region in said array is adjacent to an emission-altering element that increases said amount of light, and each said light-emitting element in said array, except for the light-emitting elements disposed at the ends of the array, is adjacent to an emission-altering element that decreases said amount of light.

17. The array of claim 16, wherein said emission-altering element that increases said amount of light is a non-emitting region of said second conductive type.

18. The array of claim 16, wherein said emission-altering element that decreases said amount of light is a region of the semiconductor layer having a trench.

19. The array of claim 16, wherein said emission-altering element that decreases said amount of light is an opaque member.

20. The array of claim 15, wherein said array has multi-layer wiring, and the emission-altering element disposed between at least one said mutually adjacent pair of light-emitting regions divides the semiconductor layer into mutually isolated blocks.

21. The array of claim 20, wherein each emission-altering element that divides the semiconductor layer into mutually isolated blocks is a region of the semiconductor layer having a trench extending completely through the semiconductor layer.

22. An array of light-emitting elements, having a semiconductor layer of a first conductive type, with a plurality of light-emitting regions of a second conductive type disposed in the semiconductor layer, comprising:

at least one emission-altering element separated from all of the light-emitting regions, disposed adjacent at least one of the light-emitting regions, altering an amount of light emitted from said at least one of the light-emitting regions, wherein said light-emitting regions form a linear array having two ends, and one said emission-altering element is disposed between every mutually adjacent pair of said light-emitting regions, wherein said array has multi-layer wiring, and the emission-altering element disposed between at least one said mutually adjacent pair of light-emitting regions divides the semiconductor layer into mutually isolated blocks, wherein each emission-altering element that divides the semiconductor layer into mutually isolated blocks is a non-emitting region of said second conductive type extending completely through the semiconductor layer.

23. The array of claim 20, wherein the emission-altering element disposed on one side of each block among said blocks is a non-emitting region of said second conductive type extending completely through the semiconductor layer, the emission-altering element disposed on the other side of each block among said blocks being a region of the semiconductor layer having a trench extending completely through the semiconductor layer.

24. The array of claim 20, wherein the emission-altering element that divides the semiconductor layer into mutually isolated blocks is equal in width to another said emission-altering element disposed between two light-emitting regions within one of said mutually isolated blocks.

25. The array of claim 20, wherein each emission-altering element is formed as an opaque member.

26. The array of claim 20, wherein each emission-altering element is formed as one of an opaque member and a region of the semiconductor layer having a trench, and wherein each light-emitting element in said array is adjacent to an emission-altering element that is formed as an opaque member, and each light-emitting element in said array, except for the light-emitting elements disposed at the ends of the array, is adjacent to an emission-altering element that is formed as a region of the semiconductor layer having a trench.

27. The array of claim 20, wherein said light-emitting elements are light-emitting diodes.

* * * * *